(12) United States Patent
Yamasaki et al.

(10) Patent No.: US 7,001,673 B2
(45) Date of Patent: Feb. 21, 2006

(54) HYDROPHILIC POLYMER HAVING SILANE COUPLING GROUP TERMINAL AND LITHOGRAPHIC PRINTING PLATE BASE

(75) Inventors: Sumiaki Yamasaki, Shizuoka (JP); Koichi Kawamura, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 564 days.

(21) Appl. No.: 10/053,617

(22) Filed: Jan. 24, 2002

(65) Prior Publication Data

US 2002/0134266 A1 Sep. 26, 2002

(30) Foreign Application Priority Data

Jan. 24, 2001 (JP) ............... P.2001-015912
Jan. 26, 2001 (JP) ............... P.2001-018889

(51) Int. Cl.
*B32B 15/04* (2006.01)
*B32B 15/08* (2006.01)
*B41N 1/00* (2006.01)
*C08G 61/00* (2006.01)
*C08G 61/04* (2006.01)

(52) U.S. Cl. ............... 428/626; 428/457; 428/461; 101/457; 528/265; 528/272; 528/28; 528/30

(58) Field of Classification Search ............... 528/10, 528/25, 26, 28, 30, 265, 272, 373; 428/626, 428/650, 331, 457, 458, 461, 450; 101/453, 101/457, 455
See application file for complete search history.

(56) References Cited

U.S. PATENT DOCUMENTS 4,650,849 A * 3/1987 Nishimura et al. ........... 528/26
5,543,440 A * 8/1996 Hayama et al. ............. 523/103

FOREIGN PATENT DOCUMENTS

JP 2001-131445 * 5/2001

* cited by examiner

*Primary Examiner*—Michael E. Lavilla
(74) *Attorney, Agent, or Firm*—Buchanan Ingersoll PC

(57) ABSTRACT

A polymer compound includes i) a polymerization unit represented by $-(CHR^3-CR^4(-L^1-Y^1))_x-(CHR^5-CR^6(-L^2-Y^2))_y-$; and ii) a silane coupling group represented by $-S-(CH_2)_n-Si-(R^1)_m(OR^2)_{3-m}$, as a terminal of the polymer, wherein $R^1$, $R^2$, $R^3$, $R^4$, $R^5$, $R^6$, n, x, y, $L^1$, $L^2$, $Y^1$ and $Y^2$ are defined in the specification. A lithographic printing plate base includes: a support; and a hydrophilic layer containing solid particles to a surface of which a hydrophilic polymer is chemically bonded.

2 Claims, No Drawings

HYDROPHILIC POLYMER HAVING SILANE COUPLING GROUP TERMINAL AND LITHOGRAPHIC PRINTING PLATE BASE

BACKGROUND OF THE INVENTION

1. Field of the Invention

The present invention relates to a novel hydrophilic polymer which has a terminal silane coupling group and is utilizable in applications such as antifogging paints, exterior antifouling paints, and in a hydrophilic layer for a lithographic printing plate base.

The present invention also relates to a lithographic printing plate base having a novel hydrophilic layer. More particularly, the invention relates to a lithographic printing plate base which, when used as a lithographic printing plate precursor, can have high hydrophilicity without a sacrifice of film strength.

2. Description of the Invention

Although various hydrophilic polymers have hitherto been known, no hydrophilic polymer having a silane coupling group at a terminal is known. This hydrophilic polymer is useful because it is widely utilizable in applications including antifogging paints and exterior antifouling paints.

The hydrophilic bases or hydrophilic layers which have hitherto been used in lithographic printing plates include an anodized aluminum base and a base or hydrophilic layer obtained by treating the anodized aluminum base with a primer, such as a silicate, poly(vinylphosphonic acid) (see Japanese Patent Laid-Open No. 1853/1995), or poly(vinylbenzoic acid), for further enhancing hydrophilicity. Investigations on such hydrophilized aluminum bases and hydrophilic layers are being made enthusiastically. Furthermore, a technique of using a polymer having sulfo groups in forming an undercoat layer for a photosensitive layer is described in Japanese Patent Laid-Open No. 101651/1984.

On the other hand, techniques concerning hydrophilic layers not for metallic supports such as aluminum supports but for flexible supports such as PET (poly(ethylene terephthalate)) or cellulose acetate supports are known. Examples of such hydrophilic layers include: the hydrophilic layer disclosed in Japanese Patent Laid-Open No. 292558/1996 which comprises a hydrophilic polymer and a hydrophobic polymer and is capable of swelling; the PET support disclosed in EP 0709228 which has a microporous hydrophilic crosslinked silicate surface; and the hydrophilic layer disclosed in Japanese Patent Laid-Open Nos. 272087/1996 and 507727/1996 which comprises a hydrophilic polymer and has been cured with a tetraalkylorthosilicate hydrolyzate.

The formation of those hydrophilic layers gives lithographic printing plates which yield satisfactory printed matters and are less apt to cause scumming (stain) in the initial stage of printing. However, from the standpoint of higher suitability for practical use, there has been a desire for a lithographic printing plate precursor which has a hydrophilic layer having higher hydrophilicity and not peeling off the support even under severer printing conditions and which gives printed matters free from scumming. Although it has been known that a hydrophilic layer can be made to have higher hydrophilicity by increasing the water-holding capacity of the hydrophilic layer, this technique arouses the following problem. In case where hydrophilic layers according to the related art are modified so as to heighten the water-holding capacity thereof, the hydrophilic layers thus obtained have enhanced swelling properties and, hence, a weakened film structure and reduced strength or have imparted adhesion to the support.

SUMMARY OF THE INVENTION

A first object of the invention is to provide a novel hydrophilic polymer which has a terminal silane coupling group and is utilizable in applications such as antifogging paints and exterior antifouling paints, and in a hydrophilic layer for a lithographic printing plate base.

A second object of the invention is to eliminate the problems of the related art. Namely, the second object is to provide a positive or negative type lithographic printing plate base which has high hydrophilicity without a sacrifice of film strength of the hydrophilic layer and which has been improved especially in the property of not causing scumming in printing and gives scumming-free (stain-free) printed matters even under severe printing conditions.

The invention according to a first aspect of the invention provides a hydrophilic polymer comprising: i) a polymerization unit represented by —(CHR$^3$—CR$^4$(-L$^1$-Y$^1$))$_x$—(CHR$^5$—CR$^6$(-L$^2$-Y$^2$))$_y$—; and coupling group represented by —S—(CH$_2$)$_n$—Si—(R$^1$)$_m$(OR$^2$)$_{3-m}$, as a terminal of the polymer, wherein R$^1$, R$^2$, R$^3$, R$^4$, R$^5$, and R$^6$ each independently represents a hydrogen atom or a hydrocarbon group having 1 to 8 carbon atoms; m represents 0, 1 or 2; n represents an integer of 1 to 8; x is 100 to 1 mol %; y is 0 to 99 mol %; x+y=100 mol %; L$^1$ and L$^2$ each independently represents a single bond or an organic connecting group; and Y$^1$ and Y$^2$ each independently represents —N(R$^7$) (R$^8$), —OH, —NHCOR$^7$, —COR$^7$, —CO$_2$M, or —SO$_3$M, wherein R$^7$ and R$^8$ each independently represents a hydrogen atom or an alkyl group having 1 to 8 carbon atoms and M represents a hydrogen atom, an alkali metal, an alkaline earth metal, or an onium.

In the present specification, the hydrophilic polymer is sometimes represented by formula (1):

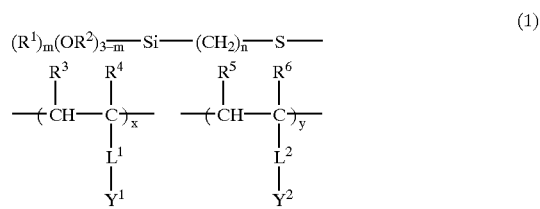

(1)

The hydrophilic polymer represented by formula (1) includes any one of a hydrogen atom, a silane coupling group represented by —S—(CH$_2$)$_n$—Si—(R$^1$)$_m$(OR$^2$)$_{3-m}$, and a polymerization initiator, as the right-side terminal.

The hydrophilic polymer represented by formula (1) preferably has a weight average molecular weight of 1,000 to 100,000, more preferably 1,000 to 50,000, particular preferably 1,000 to 30,000.

When the hydrophilic polymer of the invention, which has a silane coupling group at a terminal, is incorporated, for example, onto a surface of a base, then the base surface is hydrophilized to a high degree. For example, applying a paint containing the polymer of the invention to a base imparts a high degree of hydrophilicity to the base surface. Even when waterdrops adhere to the coated base, the waterdrops evenly spread on the base surface. The polymer can thus effectively prevent glasses, lenses, mirrors, and the like from being clouded, and is useful for preventing the loss of clarity caused by moisture and for securing visibility in rainy weather. Furthermore, urban dust, combustion products contained in automotive and other exhaust gases, such as carbon black, and hydrophobic fouling substances, such as fats and ingredients released from sealants, are less apt to adhere to the coated base. Even when such fouling matters adhere to the coated base, they can be easily removed by a rainfall or water washing.

The present inventors also made intensive investigations in order to accomplish the second object. As a result, they have found that a lithographic printing plate base having high hydrophilicity without a sacrifice of film strength is obtained by forming on a support a hydrophilic layer containing solid particles whose surface has been modified with a hydrophilic polymer. The invention has been completed based on this finding.

The invention according to a second aspect of the invention provides the following.

(1) A lithographic printing plate base comprising a support and formed thereon a hydrophilic layer containing solid particles to the surface of which a hydrophilic polymer is chemically bonded.

(2) The lithographic printing plate base as described in (1) above which has an undercoat layer between the support and the hydrophilic layer.

The inventors have succeeded in eliminating the problems by the technique for imparting exceedingly high hydrophilicity which comprises forming on a support a hydrophilic layer containing solid particles to the surface of which a hydrophilic polymer is chemically bonded. In this printing plate base, the solid particles are densely distributed on the substrate to form surface irregularities and the particle surface has been modified with a hydrophilic polymer. Due to this constitution, water readily infiltrates into the hydrophilic layer and the layer has a greatly improved water-holding capacity and excellent hydrophilicity. Furthermore, the hydrophilic polymer in the hydrophilic layer has not been crosslinked. Consequently, the hydrophilic layer is less apt to swell with water, does not undergo a decrease in film strength, and can have excellent hydrophilicity. It is thought that this effect of the invention is produced by attaining both water-holding capacity and adhesion, which have had a trade-off relationship with each other in the related art.

On this base can be formed a photo- or heat-sensitive image-forming layer. This image-forming layer comprises a positively sensitive composition or negatively sensitive composition.

The lithographic printing plate base of the invention preferably has an undercoat layer interposed between the support and the hydrophilic layer. This undercoat layer can improve adhesion between the support and the hydrophilic layer.

In the lithographic printing plate base of the invention, the surface of the support (solid surface) has preferably been roughened. The impartation of roughness to the solid surface enables the nonimage areas to have enhanced hydrophilicity, and this results in a wider difference in hydrophobicity/hydrophilicity and a further improvement in the property of not causing scumming in printing.

DETAILED DESCRIPTION OF THE INVENTION

The hydrophilic polymer of the invention will be explained below in detail.

In the hydrophilic polymer, $R^1$, $R^2$, $R^3$, $R^4$, $R^5$ and $R^6$ each represent a hydrogen atom or a hydrocarbon group having up to 8 carbon atoms. Preferred examples of the hydrocarbon group having up to 8 carbon atoms include linear, branched, or cyclic alkyl groups having up to 8 carbon atoms. Specific examples thereof include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl. These hydrocarbon groups may have one or more substituents. Preferably, $R^1$, $R^2$, $R^3$, $R^4$, $R^5$ and $R^6$ each are a hydrogen atom, methyl, or ethyl.

$L^1$ and $L^2$ each independently represents a single bond or an organic connecting group. The organic connecting group means a polyvalent connecting group made up of nonmetallic atoms. For example, it is a connecting group made up of from 1 to 60 carbon atoms, from 0 to 10 nitrogen atoms, from 0 to 50 oxygen atoms, from 1 to 100 hydrogen atoms, and from 0 to 20 sulfur atoms. Specific examples of the connecting group include the following structural units and groups each comprising a combination of two or more of these units.

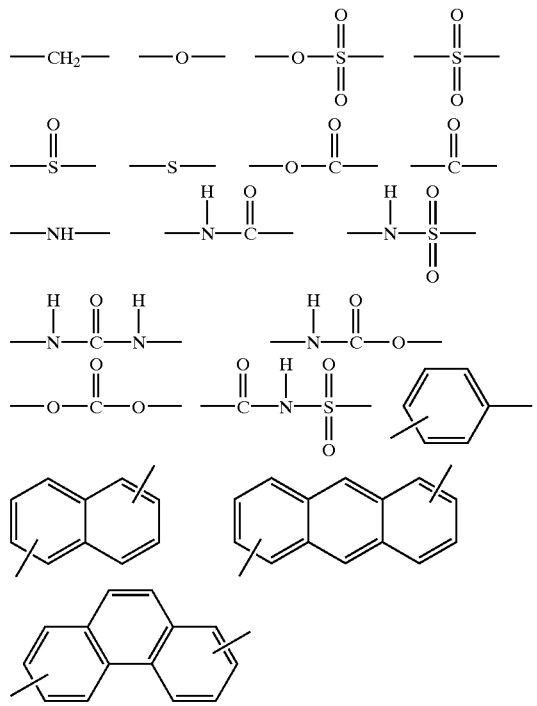

$Y^1$ and $Y^2$ each independently represent —N($R^7$)($R^8$), —OH, —NHCOR$^7$, —COR$^7$, —CO$_2$M, or —SO$_3$M, wherein $R^7$ and $R^8$ each independently represent a hydrogen atom or an alkyl group having 1 to 8 carbon atoms and M represents a hydrogen atom, an alkali metal, an alkaline earth metal, or an onium. In —N($R^7$)($R^8$), $R^7$ and $R^8$ may be bonded to each other to form a ring, which may be a heterocycle containing one or more heteroatoms selected from oxygen, sulfur, nitrogen, and other atoms.

$R^7$ and $R^8$ each independently represents a hydrogen atom, or a hydrocarbon group having 1 to 8 carbon atoms. The hydrocarbon group is preferably a linear, branched, or cyclic alkyl group having 1 to 8 carbon atoms. Examples thereof include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl.

These hydrocarbon groups in $R^7$ and $R^8$ may further have a substituent(s). When the alkyl group $R^7$ and $R^8$ has a substituent, the substituted alkyl group is constituted by binding a substituent and an alkylene group, and a monovalent non-metallic atomic group except a hydrogen atom is used as the substituent. Preferred examples of the monovalent groups include a halogen atom(F, Br, Cl, I), a hydroxyl group, an alkoxy group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-acrylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($-SO_3H$) and a conjugate base group thereof (hereinafter referred to as "a sulfonato group"), an alkoxysulfonyl group, an arylsulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, N,N-dialkylsulfamoyl group, an N-arylsulfamoyl group, an N,N-diarylsulfamoyl group, an N-alkyl-N-arylsulfamoyl group, a phosphono group ($-PO_3H_2$) and a conjugate base group thereof (hereinafter referred to as "a phosphonato group"), a dialkyphosphono group ($-PO_3(alkyl)_2$), a diarylphosphono group ($-PO_3(alkyl)_2$), an alkylarylphosphono group ($-PO_3(alkyl)(aryl)$) a monoalkylphosphono group ($-PO_3H(alkyl)$) and a conjugate base group thereof (hereinafter referred to as "an alkylphosphonato group"), a monoarylphosphono group ($-PO_3H(aryl)$) and a conjugate base group thereof (hereinafter referred to as "an arylphosphonato group"), a phosphonoxy group ($-OPO_3H_2$) and a conjugate base group thereof (hereinafter referred to as "a phosphonatoxy group"), a dialkylphosphonoxy group ($-OPO_3(alkyl)_2$), a diarylphosphonoxy group ($-OPO_3(aryl)_2$), an alkylarylphosphonoxy group ($-OPO_3(alkyl)(aryl)$), a monoalkylphosphonoxy group ($-OPO_3H(alkyl)$) and a conjugate base group thereof (hereinafter referred to as "an alkylphosphonatoxy group"), a monoarylphosphonoxy group ($-OPO_3H(aryl)$) and a conjugate base group thereof (hereinafter referred to as "an arylphosphonatoxy group), a cyano group, a nitro group, an aryl group, an alkenyl group and an alkynyl group.

Examples of an alkyl moiety in those substituent groups include the alkyl groups recited above and those of an aryl moiety in those substituent groups include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group. Examples of an alkenyl group include a vinyl group, a 1-propenyl group, a 1-butenyl group, a cinnamyl group and a 2-chloro-1-ethenyl group. Examples of an alkynyl group include an ethynyl group, a 1-propynyl group, a 1-butynyl group and a trimethylsilylethynyl group. As examples of G1 in G1CO— representing an acyl group, mention may be made of a hydrogen atom and the above-recited alkyl and aryl groups. Of those substituent groups, halogen atoms (F, Br, Cl, I), alkoxy groups, aryloxy groups, alkylthio groups, arylthio groups, N-alkylamino groups, N,N-dialkylamino group, acyloxy groups, N-alkylcarbamoyloxy groups, N-arylcarbamoyloxy groups, acylamino groups, a formyl group, acyl groups, a carboxyl group, alkoxycarbonyl groups, aryloxycarbonyl groups, a carbamoyl group, N-alkylcarbamoyl groups, N,N-dialkylcarbamoyl groups, N-arylcarbamoyl groups, N-alkyl-N-arylcarbamoyl groups, a sulfo group, a sulfonato group, a sulfamoyl group, N-alkylsulfamoyl groups, N,N-dialkylsulfamoyl groups, N-arylsulfamoyl groups, N-alkyl-N-arylsulfamoyl groups, a phosphono group, a phosphonato group, dialkylphosphono groups, diarylphosphono groups, monoalkylphosphono groups, alkylphosphonato groups, monoarylphosphono groups, arylphosphonato groups, a phosphonoxy group, a phosphonatoxy group, aryl groups and alkenyl groups are much preferred over the others.

Further, the monovalent group as $R^7$ and $R^8$ each may be a substituted alkyl group. Examples of an alkylene moiety in such a substituted alkyl group include divalent organic residues formed by removing one hydrogen atom from each of the C1–20 alkyl groups as recited above, preferably C1–12 straight-chain alkylene groups, C3–12 branched alkylene groups and C5–10 cycloalkylene groups. Suitable examples of a substituted alkyl group formed by combining a substituent and an alkylene group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-ethylbenzoylaminopropyl, 2-hydroxyethyl, 2-hydroxypropyl, carboxypropyl, methoxycarbonylethyl, allyloxycarbonylbutyl, chlorophenoxycarbonylmethyl, carbamoylmethyl, N-methylcarbamoylethyl, N,N-dipropyl-carbamoylmethyl, N-(methoxyphenyl)carbamoylethyl, N-methyl-N-(sulfophenyl)carbamoylmethyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphono-propyl, methylphosphonobutyl, methylphosphonatobutyl, triphosphonohexyl, tolylphosphonatohexyl, phosphonoxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methyl-propenylmethyl, 2-propenyl, 2-butynyl and 3-butynyl groups.

Specific examples of the hydrophilic polymer of the invention are shown below. However, the invention should not be construed as being limited to these examples.

While these examples do not clearly specify a right-side terminal of each polymer, any one of a hydrogen atom, the same silane coupling group as the left-side terminal and a polymerization initiator can be provided. Polymer Compounds 1 to 17 below show as to what are used as the polymer backbone (polymer main chain) and as the right-side silane coupling group terminal. Polymer Compounds 18 to 23 below show as to what are used as the copolymer backbone (each subscript number for copolymer units showing a molar percent ratio) and as the right-side silane coupling group terminal.

1
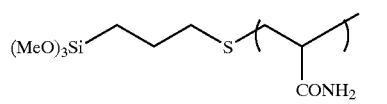

2
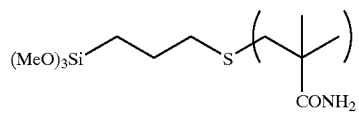

3
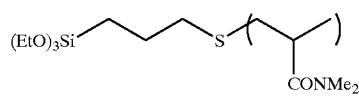

4
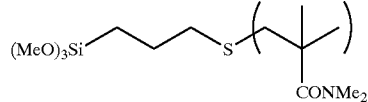

5
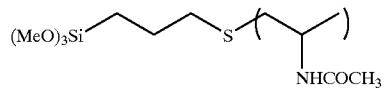

6
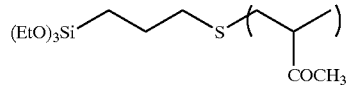

7
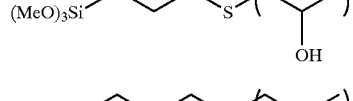

8
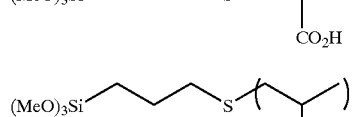

9
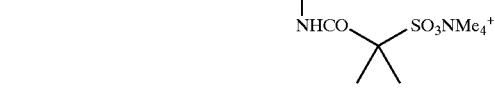

10
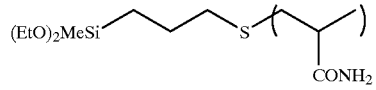

-continued

11
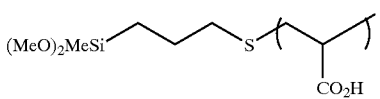

12
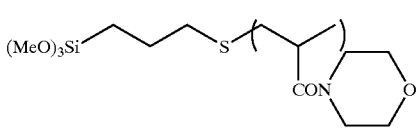

13
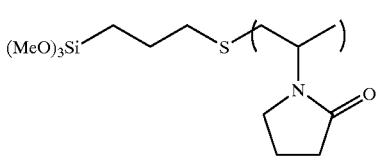

14
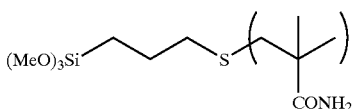

15
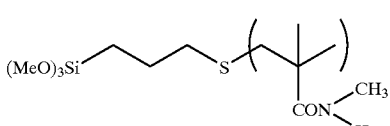

16
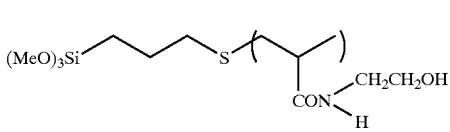

17
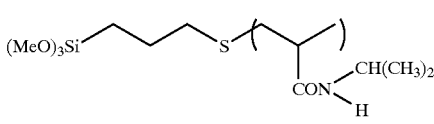

18
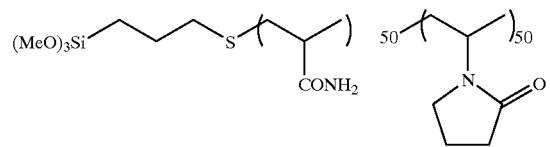

19
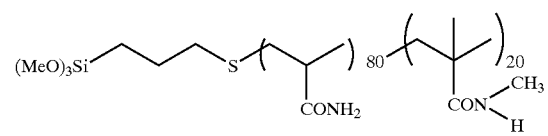

20
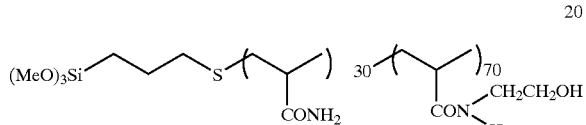

21
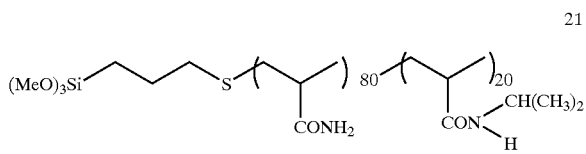

-continued

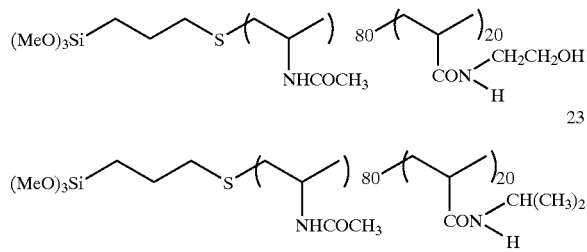

For conducting the radical polymerization for synthesizing the hydrophilic polymer of the invention, any of known methods can be used. For example, use may be made of methods described in Shin Kôbunshi Jikken-gaku 3, Kôbunshi No Gôsei To Hannô 1 (edited by The Society of Polymer Science, Kyoritsu Shuppan); Shin Jikken Kagaku Kôza 19, Kôbunshi Kagaku (I) (edited by The Chemical Society of Japan, Maruzen); and Busshitus Kôgaku Kôza, Kôbunshi Gôsei Kagaku (the publishing department of Tokyo Denki University).

More specifically, the hydrophilic polymer of the invention can be synthesized by radical polymerization from one or more unsaturated compounds each represented by the following general formula (2) or (3) and a mercapto silane compound represented by the following general formula (4). Since the mercapto silane compound (4) has a chain transfer ability, the radical polymerization can yield a polymer having a silane coupling group incorporated into a terminal of the polymer backbone.

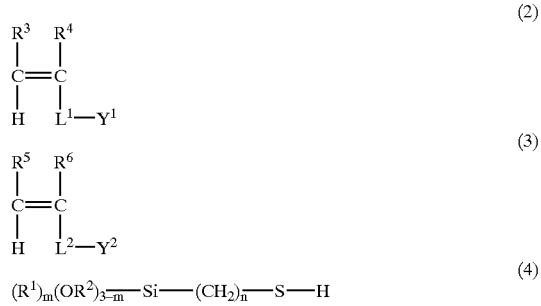

In formulae (2), (3), and (4), $R^1$ to $R^6$, $L^1$, $L^2$, $Y^1$, $Y^2$, n, and m have the same meanings as in formula (1). Those compounds are commercially available, and can be easily synthesized.

(Mode of Reaction)

In reacting the mercapto silane compound represented by general formula (4) with the unsaturated compound(s) represented by general formula (2) or (3), there are no particular limitations on modes of reaction. For example, it is preferred to conduct bulk reaction, solution reaction, suspension reaction (emulsion reaction), or the like in the presence of a free-radical initiator or while irradiating the reaction system with a high-pressure mercury lamp or the like. Methods of polymerization also are not particularly limited, and an appropriate method can be suitably selected according to purposes, such as a batch process (including processes in which feed materials are added portion-wise or successively), a semi-continuous or continuous process, or the like.

In particular, a process in which one or more unsaturated compounds each represented by general formula (2) or (3) are added portion-wise (hereinafter often referred to as "portion-wise charge process") and a process in which the unsaturated compounds are successively added (hereinafter often referred to as "increment process") are preferred polymerization methods because the unsaturated compounds can be efficiently inhibited from homopolymerizing in these processes. It is known that when, for example, a mercapto silane compound represented by general formula (4) is radical-polymerized with one or more unsaturated compounds each represented by general formula (2) or (3) in one step (in a molar ratio of 1:1), there are cases where homopolymers of the unsaturated compounds represented by general formula (2) or (3) generate in an amount of about 10% by weight although this homopolymer generation depends on polymerization conditions including temperature. In contrast, when the portion-wise addition process is employed to radical-polymerize these starting compounds, for example, in three steps, then the amount of homopolymers yielded under the same temperature and other polymerization conditions from the unsaturated compounds represented by general formula (2) or (3) can be easily reduced to below 10% by weight.

(Reactant Proportion)

The proportion of the mercapto silane compound represented by general formula (4) to the unsaturated compound(s) represented by general formula (2) or (3) to be reacted with each other also is not particularly limited. It is, however, preferred to use an unsaturated compound represented by general formula (2) and one represented by general formula (3) each in an amount of, for example, from 0.5 to 50 mol per mol of the mercapto silane compound represented by general formula (4). The reason for this is that in case where the proportions of the reactants are outside that range, side reactions are apt to take place and this may result in a reduced yield of a hydrolyzable silane compound. Consequently, the amount of each of the unsaturated compounds respectively represented by general formulae (2) and (3) to be reacted is more preferably from 1 to 45 mol, most preferably from 5 to 40 mol, per mol of the mercapto silane compound represented by general formula (4).

The proportion of the unsaturated compound represented by general formula (2) to that represented by general formula (3) to be subjected to the reaction also is not particularly limited. However, the unsaturated compound represented by general formula (2) is used in an amount of preferably from 100 to 1 mol, more preferably from 100 to 5 mol, per 100 mol of the sum of the unsaturated compounds respectively represented by general formulae (2) and (3).

(Free-Radical Initiator)

The free-radical initiator is preferably an azo free-radical initiator or an organic peroxide, more preferably an azo free-radical initiator. Preferred examples of the azo free-radical initiator include 2,2'-azobisisobutyronitrile, 1,1'-azobis(cyclohexane-1-carbonitrile), 2,2'-azobis(4-methoxy-2,4-dimethylvaleronitrile), 2,2'-azobis(2,4-dimethylvaleronitrile), 2,2'-azobis(2-methylbutyronitrile), 1-[(1-cyano-1-methylethyl)azo]formamide, 2-phenylazo-4-methoxy-2,4-dimethylvaleronitrile, dimethyl 2,2'-azobis(2-methylpropionate), 2,2'-azobis{2-methyl-N-[1,1-bis(hydroxymethyl)-2-hydroxyethyl]propionamide}, 2,2'-azobis{2-methyl-N-[1,1-bis (hydroxymethyl) ethyl]propionamide}, 2,2'-azobis[2-methyl-N-(2-hydroxyethyl)propionamide], 2,2'-azobis[2-(5-methyl-2-imidazolin-2-yl)propane] dihydrochloride, 2,2'-azobis[2-(2-imidazolin-2-yl)propane] dihydrochloride, 2,2'-azobis[2-(4, 5,6,7-tetrahydro-1H-1,3-diazepin-2-yl)propane] dihydrochloride, 2,2'-azobis[2-(3,4,5,6-tetrahydropyrimidin-2-yl) propane] dihydrochloride, 2,2'-azobis[2-(5-hydroxy-3,4,5,6-tetrahydropyrimidin-2-yl)propane] dihydrochloride, 2,2'-azobis{2-[1-(2-hydroxyethyl)-2-imidazolin-2-yl] propane} dihydrochloride, 2,2'-azobis[2-(2-imidazolin-2-yl) propane], 2,2'-azobis(2-methyl-N-phenylpropionamidine) dihydrochloride, 2,2'-azobis[N-(4-chlorophenyl)-2-methylpropionamidine] dihydrochloride, 2,2'-azobis[N-(4-hydroxyphenyl)-2-methylpropionamidine] dihydrochloride, 2,2'-azobis[2-methyl-N-(phenylmethyl)propionamidine] dihydrochloride, 2,2'-azobis[2-methyl-N-(2-propenyl)propionamidine] dihydrochloride, 2,2'-azobis(2-methylpropionamidine) dihydrochloride, and 2,2'-azobis[N-(2-hydroxyethyl)-2-methylpropionamidine] dihydrochloride. Such azo compounds may be used alone or in combination of two or more thereof.

The amount of the free-radical initiator to be added is preferably from 0.001 to 20 parts by weight, more preferably from 0.1 to 10 parts by weight, most preferably from 0.1 to 5 parts by weight, per 100 parts by weight of the sum of the unsaturated compound(s) represented by general formula (2) or (3) and the mercapto silane compound represented by general formula (4).

(Reaction Temperature)

The temperature at which the mercapto silane compound represented by general formula (4) is reacted with the unsaturated compound(s) represented by general formula (2) or (3) is not particularly limited. It is, however, preferred to use a temperature in the range of, for example, from −50 to 200° C. The reasons for this are as follows. Reaction temperatures lower than −50° C. may result in considerably reduced reactivity of these compounds. On the other hand, reaction temperatures exceeding 200° C. may result in excessive limitations on the kinds of usable solvents or may tend to result in side reactions. Consequently, the reaction temperature is more preferably from 0 to 100° C., most preferably from 30 to 100° C. In the case where an unsaturated compound which has a high rate of radical homopolymerization, e.g., acrylic acid, is used as one of the unsaturated compounds according to the invention, the most preferred range of the reaction temperature is from 30 to 70° C. By using a reaction temperature in this range, the homopolymerization of the unsaturated compounds can be more efficiently inhibited without lowering the rate of reaction.

(Reaction Time)

The time period of reaction depends on the reaction temperature and other factors. However, from the standpoint of relationship between the certainty of reaction and productivity, the reaction time is usually in the range of preferably from 0.5 to 100 hours, more preferably from 1 to 24 hours.

(Solvent)

In reacting the mercapto compound represented by general formula (4) with the unsaturated compound(s) represented by general formula (2) or (3), a solvent is preferably used for evenly reacting these compounds. Examples of the solvent include ethyl lactate, methyl ethyl ketone, cyclohexanone, dimethyl sulfoxide, ethylene glycol monobutyl ether acetate, diethyl diglycol, methylpropylene glycol, diacetone alcohol, methoxypropyl acetate, diethylene glycol monobutyl ether acetate, diethylene glycol monoethyl ether acetate, ethyl 3-ethoxypropionate, diethylene glycol dimethyl ether, N,N-dimethylacetamide, 1,3-dimethyl-2-imidazolidinone, methyl 3-methoxypropionate, 2-heptanone, toluene, tetrahydrofuran, dioxane, chloroform, hexane, methanol, and ethanol. These may be used alone or in combination of two or more thereof. The amount of the solvent to be used is preferably from 1 to 10,000 parts by weight, more preferably from 50 to 1,000 parts by weight, most preferably from 50 to 800 parts by weight, per 100 parts by weight of the sum of the mercapto silane compound represented by general formula (4) and the unsaturated compound(s) represented by general formula (2) or (3).

(Reaction Atmosphere)

The atmosphere in which the mercapto silane compound represented by general formula (4) is reacted with the unsaturated compound(s) represented by general formula (2) or (3) is not particularly limited. It is, however, preferred to conduct the radical reaction of these compounds, for example, after nitrogen bubbling into the reaction system or after the reaction system is deoxidized with ultrasonic. This is because when the radical reaction is conducted in nitrogen or the like, the formation of a disulfide compound due to the coupling reaction of mercapto groups with each other can be efficiently inhibited. Although the coupling reaction of mercapto groups often results in coloration, this reaction can be effectively prevented and a highly transparent hydrolyzable silane compound can be obtained. With respect reaction atmospheres, there is a problem that in case where water is present in the reaction system, spontaneous hydrolysis of the alkoxyl group is apt to proceed during the radical reaction. Especially in the case where a hydrolyzable silane having a carboxyl group is subjected to the radical reaction, the alkoxyl group hydrolysis is apt to readily proceed even in the presence of a small amount of water. It is therefore preferred that when a liquid starting material is used, the starting material be dehydrated with a dehydrant such as, e.g., a molecular sieve, calcium hydride, or magnesium sulfate or distilled beforehand in nitrogen optionally in the presence of any of these dehydrants.

As stated above, a surface of a base can be hydrophilized to a high degree by incorporating the hydrophilic polymer of the invention onto the base surface. Consequently, the polymer can be effectively utilized in various coating materials, especially antifogging paints and exterior antifouling paints.

The invention according to the second aspect is explained below.

[Lithographic Printing Plate Base]

The hydrophilic layer to be formed on a support is explained first; this layer is characteristic of the lithographic printing plate base of the invention.

The hydrophilic layer according to the second aspect of the invention contains solid particles to the surface of which a hydrophilic polymer is chemically bonded. The chemical bonding of a hydrophilic polymer to the surface of solid particles is herein referred to also as surface modification.

The solid particles to which a hydrophilic polymer is chemically bonded are preferably inorganic particles. Examples thereof include metal oxides such as zinc oxide, titanium dioxide, iron oxide, and zirconia, silicon-containing oxides which themselves show no absorption in the visible region, such as silicic anhydride, hydrated calcium silicate, and hydrated aluminum silicate (which are also called white carbon), and clay mineral particles such as clay, talc, kaolin, and zeolite.

The average particle diameter of the inorganic particles is preferably 10 $\mu$m or smaller, more preferably from 5 nm to 5 $\mu$m, most preferably from 10 nm to 5 $\mu$m. Use of inorganic particles having an average particle diameter within that range is advantageous in that not only photo-crosslinkable particles, which will be described later, can be stably produced, but also satisfactory adhesion to the support can be maintained and the particles located near the surface can be held satisfactorily.

Silicon-containing oxides are especially preferred among the inorganic particles enumerated above from the standpoints of hydrophilicity, film strength, and ease of surface modification with a hydrophilic polymer. Specific examples thereof include Snowtex ZL (particle diameter, 70–100 nm; 40% colloidal solution of silica) manufactured by Nissan Chemical Industries, Ltd.; Sylysia 350 (particle diameter, 3.5 μm) manufactured by Fuji Silysia Chemical Ltd.; AEROSIL 130 (particle diameter, 160 nm; silica) manufactured by Nippon Aerosil Co., Ltd.; AEROSIL 200 (particle diameter, 16 nm; silica) manufactured by Nippon Aerosil Co., Ltd.; and Mizucasil P-527U (particle diameter, 60 nm; silica) manufactured by Mizusawa Industrial Chemicals, Ltd.

In the second aspect of the invention, a hydrophilic polymer is chemically bonded to the surface of the solid particles. The hydrophilic polymer to be used and the state of bonding thereof to the solid particles are not particularly limited. Although the form (a) shown below is common, the graft form (b) shown below is preferred in the invention in which ends of hydrophilic polymer chains are chemically bonded directly to the surface of a solid particle.

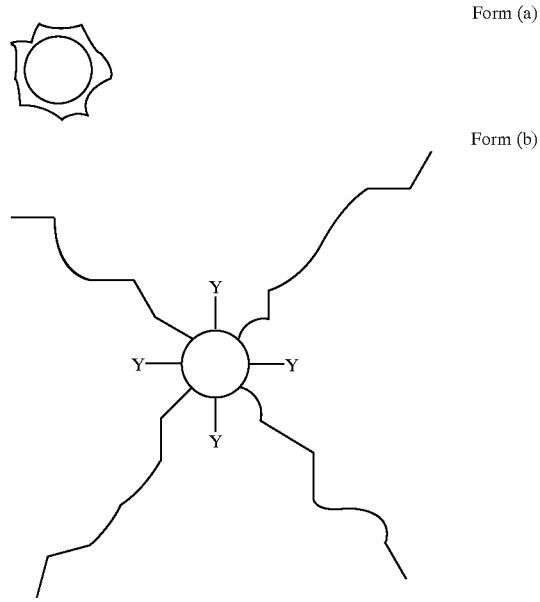

Form (a)

Form (b)

In the case of the graft form (b), the hydrophilic polymer is bonded to the surface of solid particles in a manner similar to grafting and absorbs a large amount of water to heighten the water-holding capacity. As a result, the hydrophilic layer has high hydrophilicity. Furthermore, since the reactive groups Y (e.g., OH groups) present on the solid particles partly remain exposed on the particle surface after the surface modification with the hydrophilic polymer, it is possible to crosslink the solid particles with one another by adding a crosslinking agent. Thus, the hydrophilic layer can have high hydrophilicity while retaining excellent film strength.

Hydrophilic polymers which can be used in the second aspect of the invention are not particularly limited. Examples of the hydrophilic functional groups possessed by the hydrophilic polymers include a carboxy group, sulfo group, sulfino group, phosphono group, amino group and salts thereof, amide group, hydroxyl group, ether group, and polyoxyethylene group.

The surface modification with a hydrophilic polymer can be conducted by suitably using a known technique. For example, a hydrophilic polymer having a structure comprising a polymer backbone having a silane coupling group at a terminal thereof can be easily incorporated onto the surface of silica particles through a sol-gel reaction.

An examples of the hydrophilic polymer having a structure comprising a polymer backbone having a silane coupling group at a terminal thereof include the hydrophilic polymer represented by formula (1) explained in the first aspect of the present invention.

Another method for the surface modification with a hydrophilic polymer comprises treating the surface of silica with a silane coupling agent having a polymerization-initiating ability and then graft-polymerizing a hydrophilic monomer. Thus, particles whose surface has been modified with a hydrophilic polymer can be obtained.

Examples of hydrophilic monomers which can be used in the method include monomers having a carboxyl, sulfo, phosphate, or amino group and salts thereof, such as (meth) acrylic acid and alkali metal salts and amine salt thereof, 2-hydroxyethyl (meth)acrylate, (meth)acrylamide, N-monomethylol(meth)acrylamide, N-dimethylol(meth) acrylamide, allylamine and hydrohalogenic acid salts thereof, 3-vinylpropionic acid and alkali metal salts and amine salt thereof, vinylsulfonic acid and alkali metal salts and amine salt thereof, 2-sulfoethylene (meth)acrylate, 3-sulfopropylene (meth)acrylate and alkali metal salts and amine salt thereof, polyoxyethylene glycol mono(meth) acrylate, 2-acrylamido-2-methylpropanesulfonic acid and alkali metal salts and amine salt thereof, acid phosphooxy-polyoxyethylene glycol mono(meth)acrylate, and 2-trimethylaminoethyl (meth) acrylate and hydrohalogenic acid salts thereof.

The surface modification can be conducted according to known methods, such as those described in, e.g., Noboru Suzuki, Nobuko Yuzawa, Atsushi Endo, and Hiroshi Utsugi, *Shikizai*, 57, 429(1984); Hiroshi Yoshioka and Masayuki Ikeno, *Hyômen*, 21, 33(1983); Hiroshi Utsugi, *Hyômen*, 16, 525(1978); K. Tanaka et al., *Bull. Chem. Soc. Jpn.*, 53, 1242(1980); M. L. Hair and W. Hertl, *J. Phys. Chem.*, 77, 1965(1973); Ya. Davydov et al., *Chromtographia*, 14, 13(1981); K. Unger et al., *Colloid Polym. Sci.*, 252, 317 (1974); R. Burwell and O. Leal, *J. Chem. Soc. Chem Commun.*, 342(1974); W. Stoeber, *Kolloid-Z*, 149, 39(1956); K. Yoshinaga et al., *Polym. Adv. Technol.*, 3, 91(1992); N. Tsubokawa et al., *Polym. J.*, 21, 475(1989); and Franz. Pat. 1368765DAS 1163784, or in patent and other documents cited therein.

Usable crosslinking agents include hydrolyzable polymerizable compounds represented by the following general formula (II).

$$(R^{5'})_m-X-(OR^{6'})_{4-m} \quad (II)$$

In formula (II), $R^{5'}$ and $R^{6'}$ may be the same or different and each represent an alkyl group or an aryl group; X represents a silicon, aluminum, titanium, or zirconium atom; and m represents an integer of 0 to 2. When $R^{5'}$ or $R^{6'}$ represents an alkyl group, it preferably has 1 to 4 carbon atoms. The alkyl or aryl group may have one or more substituents. The compounds represented by formula (II) preferably are low-molecular compounds having a molecular weight of 1,000 or lower.

Examples of the hydrolyzable polymerizable compounds containing aluminum include trimethoxy aluminate, triethoxy aluminate, tripropoxy aluminate, and tetraethoxy aluminate. Examples of the compounds containing titanium include trimethoxytitanate, tetramethoxytitanate, triethoxytitanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate. Examples of the compounds containing zirconium include the zirconates corresponding to those titanates.

Examples of the hydrolyzable polymerizable compounds containing silicon include trimethoxysilane, triethoxysilane, tripropoxysilane, tetramethoxysilane, tetraethoxysilane, tetrapropoxysilane, methyltrimethoxysilane, ethyltriethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, and diphenyldiethoxysilane.

Especially preferred examples of those compounds include tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, and diphenyldiethoxysilane.

In the second aspect of the invention, the surface-modified particles may be of one kind or two or more kinds, and the compounds represented by general formula (II) may be used alone or in combination of two or more thereof. The compounds represented by general formula (II) may have undergone partial hydrolysis and subsequent dehydrating condensation. For enhancing the solution-state storage stability of an image-forming material prior to application to a base, it is effective to protect the active metal hydroxyl groups, e.g., silanol groups (Si—OH), of an inorganic polymer formed by the partial hydrolysis and polymerization of a hydrolyzable polymerizable organometallic compound represented by general formula (II). The protection of the silanol groups can be accomplished by etherifying the silanol groups (conversion to Si—OR) with a higher alcohol such as t-butanol or isopropyl alcohol (R does not mean a specific group but merely means some group). For example, the protection can be accomplished by adding the higher alcohol to an inorganic phase containing the fine silica particles dispersed therein. The storage stability of this inorganic phase can be further improved by dehydrating the inorganic phase by a suitable method according to properties of the inorganic phase, for example, by heating the inorganic phase and distilling off the water released. In the case where an acid or base which can function as a catalyst for the hydrolytic polymerization, e.g., hydrochloric acid or ammonia, is present in the inorganic phase, it is also generally effective to lower the concentration of the acid or base. This can be easily accomplished by neutralizing the inorganic phase with an acid or base.

In the invention, the surface-modified particle/crosslinking agent composite obtained by crosslinking the surface-modified particles with a crosslinking agent represented by general formula (II) may be contained in the hydrophilic layer of the lithographic printing plate base in an amount of generally from 2 to 90% by weight, preferably from 5 to 80% by weight, more preferably from 10 to 50% by weight, based on all solid components of the hydrophilic layer. In case where the content of the particles is lower than 2% by weight, the hydrophilic layer has an insufficient water-holding capacity and scumming is apt to occur. In case where the content thereof exceeds 50% by weight, not only the hydrophilic layer has reduced strength, resulting in reduced printing durability, but also the adhesion between the support and the hydrophilic layer is reduced.

[Methods for Forming Surface-Modified Particle/Crosslinking Agent Composite]

The organic/inorganic composite in the invention, which comprises surface-modified particles and a crosslinking agent, is prepared through hydrolytic polymerization. Any known method may be used for the polymerization. For example, methods described in *Zoru-Geru Hô No Kagaku* (Agune Shofusha) can be used. A preferred example is as follows. An acid (e.g., phosphoric acid, hydrochloric acid, sulfuric acid, or acetic acid), especially preferably phosphoric acid or hydrochloric acid, or an alkali (e.g., ammonia water) is added as a catalyst to an alcohol solution, preferably methanol or ethanol solution, containing dispersed therein the surface-modified particles according to the invention and a crosslinking agent (e.g., a compound represented by general formula (II)) to prepare a starting solution. Subsequently, the solution is stirred at from 0 to 100° C., preferably from 10 to 80° C., with refluxing for from 5 minutes to 6 hours, especially preferably from 10 minutes to 2 hours, to cause hydrolytic polymerization. Thus, the organic/inorganic composite comprising the surface-modified particles and crosslinking agent can be formed.

The hydrophilic layer according to the invention can be produced usually by dissolving the ingredients in a solvent and applying the solution to an appropriate support. The solvent to be used here is not particularly limited. Examples thereof include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water.

Those solvents may be used alone or as a mixture of two or more thereof. The concentration of the ingredients (all solid ingredients including additives) in the solvent is preferably from 1 to 50% by weight. The amount of the coating (on a solid basis) formed on the support through application and drying is generally preferably from 0.5 to 5.0 g/m². For the application, various techniques can be used. Examples thereof include bar coater coating, spin coating, spray coating, curtain coating, dip coating, air-knife coating, blade coating, and roll coating.

The thickness of the hydrophilic layer according to the invention is preferably from 0.001 to g/m², more preferably from 0.01 to 5 g/m². When the hydrophilic layer has a thickness within that range, not only the hydrophilicity-imparting effect of the invention can be satisfactorily exhibited, but also the hydrophilic layer has satisfactory adhesion to the support and attains sufficient printing durability.

Although the support to be used in the second aspect of the invention is not particularly limited, it is preferably a dimensionally stable platy support. Examples thereof include papers, papers laminated with a plastic (e.g., poly (ethylene terephthalate), polyethylene, polypropylene, or polystyrene), sheets of metals (e.g., aluminum, zinc, and copper), films of plastics (e.g., cellulose diacetate, cellulose triacetate, cellulose propionate, cellulose butyrate, cellulose acetate butyrate, cellulose nitrate, poly(ethylene terephthalate), polyethylene, polystyrene, polypropylene, polycarbonates, and poly(vinyl acetal)s), and papers or plastic films coated with any of those metals by laminating or vapor deposition.

Preferred supports for use in the invention are polyester films and aluminum sheets. Especially preferred of these are polyester films because they can function also as the support surface described above.

Preferred aluminum sheets for use in the invention include sheets of pure aluminum and sheets of an alloy of aluminum as the main component with a slight amount of one or more other elements. Also usable is a plastic film coated with aluminum by laminating or vapor deposition. Examples of the non-aluminum elements contained in the aluminum alloy include silicon, iron, manganese, copper, magnesium, chromium, zinc, bismuth, nickel, and titanium. The content of such non-aluminum elements in the alloy is up to 10% by weight at the most. Although a sheet of pure aluminum is especially preferred in the invention, an aluminum sheet containing a slight amount of non-aluminum elements may be used because completely pure aluminum is difficult to produce by the current refining technology. As described above, the aluminum sheet to be used in the invention is not limited in composition and can be suitably selected from sheets of known aluminum materials in general use. The thickness of the aluminum sheet to be used in the invention is generally about from 0.1 to 0.6 mm, preferably from 0.15 to 0.4 mm, more preferably from 0.2 to 0.8 mm.

The surface of the support to be used in the invention has preferably been roughened as stated above. Recesses and protrusions formed on the surface (solid surface) of the support to be used in the invention will be explained below.

(Regulation of Surface Recesses and Protrusions)

Values of two-dimensional-roughness parameters are as follows. The center-line average roughness $R_a$ may be from 0.1 to 1 μm. The maximum height $R_y$ may be from 1 to 10 μm. The ten-point average roughness $R_z$ may be from 1 to 10 μm. The average distance between recesses and protrusions $S_m$ may be from 5 to 80 μm. The average distance between local peaks S may be from 5 to 80 μm. The maximum height $R_t$ may be from 1 to 10 μm. The center-line peak height $R_p$ may be from 1 to 10 μm. The center-line valley depth $R_v$ may be from 1 to 10 μm.

Those two-dimensional-roughness parameters are based on the following definitions.

[Center-Line Average Roughness $R_a$] From a roughness curve is selected out a section having a measuring length L in the direction of the center line. The arithmetic mean of the absolute values of deviation between the center line and the roughness curve in this section is taken as the center-line average roughness $R_a$.

[Maximum height $R_y$] From the roughness curve is selected out a section having a standard length in the direction of the mean line. The distance between the peak line and the valley line in this section is measured in the vertical direction for the roughness curve and is taken as the maximum height $R_y$.

[Ten-point average roughness] From the roughness curve is selected out a section having a standard length in the direction of the mean line. In this section, the absolute values of the altitudes ($Y_p$) of the five highest peaks in the vertical direction based on the mean line are averaged, and the absolute values of the altitudes ($Y_v$) of the five deepest valleys in the vertical direction based on the mean line are averaged. The sum of the two averages in terms of micrometer (μm) is taken as the ten-point average roughness.

[Average distance between recesses and protrusions $S_m$] From the roughness curve is selected out a section having a standard length in the direction of the mean line. In this section, the mean line corresponding to each peak and a valley adjacent thereto is determined, and all these mean lines are summed up. The arithmetic mean value of these distances between many recesses and protrusions in terms of millimeter (mm) is taken as the average distance $S_m$.

[Average distance between local peaks S] From the roughness curve is selected out a section having a standard length in the direction of the mean line. In this section, the length of the mean line corresponding to each pair of adjacent local peaks is determined. The arithmetic mean value of these distances between many local peaks in terms of millimeter (mm) is taken as the average distance S.

[Maximum height $R_t$] From the roughness curve is selected out a section having a standard length. Two straight lines parallel to the center line are drawn so that the section is sandwiched between the straight lines. The distance between the two straight lines is taken as the maximum height $R_t$.

[Center-line peak height $R_p$] From the roughness curve is selected out a section having a measuring length L in the direction of the center line. The distance between the center line and the straight line parallel to the center line and passing through the highest peak in the section is taken as the center-line peak height $R_p$.

[Center-line valley depth $R_v$] From the roughness curve is selected out a section having a measuring length L in the direction of the center line. The distance between the center line and the straight line parallel to the center line and passing through the deepest valley in the section is taken as the center-line valley depth $R_v$.

(Kinds of Methods for Forming Recesses and Protrusions)

Various techniques can be used for roughening the solid surface. For example, surface roughness can be formed by sandblasting the solid surface or mechanically rubbing the surface with, e.g., a brush to abrade a surface layer and form recesses. Mechanical embossing also can be used for forming recesses and protrusions. Gravure printing or the like may be used to form protrusions on the surface and thereby form surface roughness. A technique such as coating or printing may be used to form a layer containing fine solid particles (matting agent) on the solid surface to thereby form surface roughness. Fine solid particles may be incorporated (as an additive) into a polymer at the stage in which the polymer is formed into a film to thereby form a polymer film having recesses and protrusions on the surface thereof. Furthermore, surface roughness may be formed by conducting a treatment such as a solvent treatment, corona discharge treatment, plasma treatment, electron beam irradiation treatment, or X-ray irradiation treatment. Such techniques may be used in combination of two or more thereof. Especially preferred are the technique of forming surface roughness by sandblasting or resin printing and the technique of forming recesses and protrusions by incorporating fine solid particles.

(Fine-Solid-Particle Method)

As the fine solid particles can be used various kinds of materials such as fine metal particles, fine metal oxide particles, and fine particles of an organic or inorganic, high-molecular or low-molecular substance. Specific examples of the fine particles include a copper powder, tin powder, iron powder, zinc oxide powder, silicon oxide powder, titanium oxide powder, aluminum oxide powder, molybdenum disulfide powder, calcium carbonate powder, clay, mica, cornstarch, boron nitride, silicone resin particles, polystyrene resin particles, fluororesin particles, acrylic resin particles, polyester resin particles, acrylonitrile copolymer resin particles, zinc stearate, and calcium behenate. The average particle diameter of such fine particles is preferably 0.05 µm or larger, more preferably 0.1 µm or larger. In the case where fine particles are adhered to a sheet surface or a layer containing fine particles is formed on a sheet surface, the average particle diameter of the fine particles almost corresponds to the size of the resultant surface recesses and protrusions. In the case where fine particles are incorporated as an additive into a sheet, the size of the resultant surface recesses and protrusions is determined by the average particle diameter of the fine particles and the thickness of the sheet. Consequently, in the latter case, the particle diameter most suitable for obtaining an optimal size of recesses and protrusions should be determined based on experiments on sheet/fine particle combinations.

Examples of methods for forming recesses and protrusions on a substrate surface by fixing fine solid particles thereto include: a method in which fine solid particles are added prior to film formation and a film is formed from the resultant composition; a method in which a fluid prepared by dispersing fine solid particles into a binder is applied and dried; a method in which after film formation fine particles are forced into the film by mechanical pressing; and a method in which after film formation fine solid particles are electrodeposited thereon.

Specific examples of the method in which fine solid particles are added prior to film formation and a film is formed from the resultant composition include the following. A PET master batch containing a pigment as fine solid particles is melt-extruded to form a film on a cooling drum, and the film is stretched first in the machine direction and then in the transverse direction and is finally heat-treated. Thus, a PET film having surface recesses and protrusions is obtained. The pigment can be one comprising one or more of titanium oxide, alumina, and silica. The center-line average surface roughness of the film can be regulated by regulating the particle diameter and amount of the pigment to be incorporated. For example, the roughness can be regulated by selecting a pigment having a particle diameter in the range of about from 1 to 10 µm and adding the pigment in an amount in the range of about from 0.5 to 5% by weight. The larger the particle diameter of the pigment and the larger the amount thereof, the more the center-line average surface roughness increases. For obtaining desired surface recesses and protrusions, it is necessary to select a pigment particle diameter and regulate the amount of the pigment to be incorporated.

(Sandblasting Method)

Sandblasting is a technique in which an abrasive material having a small particle size is projected at a high speed onto a surface of a polymer film to thereby roughen the film surface. This sandblasting treatment may be conducted by a known method. For example, the treatment can be accomplished by forcibly blowing carborundum (silicon carbide powder), metal particles, or the like against a film surface together with compressed air and then water-washing and drying the film surface. The center-line average surface roughness to be formed on the film by sandblasting can be regulated by regulating the particle diameter of the particles to be blown and the amount of the abrasive material to be used for the treatment (frequency of treatment per unit area). The larger the particle diameter and the larger the abrasive material amount, the higher the center-line average surface roughness of the film surface.

More specifically, since sandblasting is a treatment in which an abrasive material is blown against a film surface with compressed air to thereby treat the surface, the recesses and protrusions to be thus formed are regulated by controlling conditions for the sandblasting treatment.

In the treatment in which an abrasive material is blown from a sandblast nozzle against a film, the treatment conditions which should be regulated include the amount of the abrasive material to be blown (blasting amount), the angle between the sandblast nozzle and the film (blasting angle), and the distance between the nozzle and film (blasting distance). An abrasive material placed in a hopper is projected from a sandblast nozzle by means of compressed air sent from an air chamber and blown against a surface of a film to thereby sandblast the surface under optimized conditions. This method is described as a known technique in, e.g., Japanese Patent Laid-Open Nos. 34866/1996, 90827/1999, and 254590/1999.

In performing the sandblasting, it is necessary to select treatment conditions so that neither the abrasive material nor the resultant abrasion dust remains on the film surface after the treatment and that the film strength does not decrease. Such treatment conditions can be suitably determined from experiences.

Examples of such treatment conditions include the following. As the abrasive material is used silica sand or another abrasive material. However, it is preferred to use silica sand having a particle diameter of preferably from 0.05 to 10 mm, more preferably from 0.1 to 1 mm. The blasting distance is preferably from 100 to 300 mm. The blasting angle is preferably from 45 to 90 degrees, more preferably from 45 to 60 degrees. Furthermore, the blasting amount is preferably from 1 to 10 kg/min. These conditions not only prevent the abrasive material or the resultant abrasion dust from remaining on the polyimide film surface after the sandblasting, but are suitable for controlling the depth of a layer to be removed by abrasion. The abrasion depth is preferably regulated to 0.01 to 0.1 µm at the most, whereby the film strength can be prevented from decreasing.

In the invention, an undercoat layer is preferably formed between the support and the hydrophilic layer. A preferred undercoat layer in the invention is an undercoat layer comprising a hydrophilic binder and silica.

As the hydrophilic binder in the undercoat layer can usually be used a protein, preferably gelatin. However, the gelatin may be partly or wholly replaced with a synthetic, semisynthetic, or natural polymer. Examples of the synthetic substitute for gelatin include poly(vinyl alcohol), poly(N-vinylpyrrolidone), polyvinylimidazole, polyvinylpyrazole, polyacrylamide, poly(acrylic acid), and derivatives, especially, copolymers of these. Examples of the natural substitute for gelatin include other proteins, e.g., zein, albumin, and casein, cellulose, saccharide, starch, and alginates. Examples of the semisynthetic substitute for gelatin generally include modified natural products. Specific examples thereof include gelatin derivatives obtained by modifying gelatin with an alkylating agent or acylating agent or by grafting a polymerizable monomer onto gelatin and cellulose derivatives such as hydroxyalkyl celluloses, carboxymethyl cellulose, phthaloylcellulose, and cellulose sulfate.

The silica contained in the undercoat layer preferably is anionic silicon dioxide. The colloidal silica has a surface area of preferably at least 100 m$^2$/g, more preferably at least 300 m$^2$/g.

The surface area of colloidal silica is measured by the BET method proposed by S. Brunauer, P. H. Emmett, and E. Teller in *J. Amer. Chem. Soc., Vol.* 60 (1938), pp. 309–312.

The silica dispersion may contain other substances such as, e.g., an aluminum salt, stabilizer, and bactericide.

This kind of silica is commercially available under the trade names of KIESELSOL 100, KIESELSOL 300, and KIESELSOL 500 ("KIESELSOL" is a registered trademark of Farbenfabriken Bayer AG, Leverkusen, Germany; each numeral indicates surface area in terms of m$^2$/g).

The ratio of the weight of the hydrophilic binder to that of the silica in the undercoat layer is preferably lower than 1. Although the lower limit of that ratio is not so important, it is preferably 0.2 or higher. The weight ratio of the hydrophilic binder to the silica is more preferably from 0.25 to 0.5.

The amount of the undercoat layer to be formed is preferably larger than 200 mg/m$^2$ and smaller than 750 mg/m and is more preferably from 250 to 500 mg/m$^2$.

Coating with the undercoat layer composition described above is preferably conducted from an aqueous colloidal dispersion in the presence of a surfactant according to need.

[Explanation on Image-Forming Layer]

(Photosensitive Layer or Heat-Sensitive Layer)

An image-forming layer (photosensitive layer or heat-sensitive layer) is formed on the hydrophilic layer in the invention. This image-forming layer comprises a positively sensitive composition or negatively sensitive composition.

(Positively Sensitive Composition)

The following known positively sensitive compositions ((a) and (b)) are suitable for use in the invention.

(a) A conventional positively photosensitive composition comprising naphthoquinonediazide and a novolac resin.

(b) A chemical amplification type positively photosensitive composition comprising a combination of an alkali-soluble compound protected by an acid-decomposable group and an acid generator.

These compositions (a) and (b) are well known in this field. However, it is more preferred to use either of these in combination with any of the following positively sensitive compositions ((c) to (f)).

(c) The laser light-sensitive positive composition described in Japanese Patent Laid-Open No. 282672/1998, which comprises a sulfonic ester polymer and an infrared absorber and from which a lithographic printing plate necessitating no development can be produced.

(d) The laser light-sensitive positive composition described in EP 652483 and Japanese Patent Laid-Open No. 502260/1994, which comprises a carboxylic ester polymer and either an acid generator or an infrared absorber and from which a lithographic printing plate necessitating no development can be produced.

(e) The laser light-sensitive positive composition described in Japanese Patent Laid-Open No. 095421/1999, which comprise an alkali-soluble compound and a thermally decomposable substance which in an undecomposed state serves to substantially reduce the solubility of the alkali-soluble compound.

(f) A positive composition for alkali development which comprises an infrared absorber, a novolac resin, and a dissolution inhibitor and from which an alkali development type positive lithographic printing plate can be produced.

Some of the compounds used in the positively sensitive compositions (a) to (f) will be explained below.

"Acid Generator"

The acid generator which may be used in the positively sensitive composition is a compound which generates an acid by the action of heat or light. Examples of such acid generators in general use include photoinitiators for cationic photopolymerization, photoinitiators for free-radical photopolymerization, photodecolorants or photodiscoloring agents for dyes, known compounds which generate an acid upon light irradiation and are used in, e.g., microresists, and mixtures of these. One or more acid generators may be suitably selected from these and used.

Specific examples of the acid generator include onium salts such as: the diazonium salts described in S. I. Schlesinger, *Photogr. Sci. Eng.*, 18, 387 (1974) and T. S. Bal et al., *Polymer,* 21, 423 (1980); the ammonium salts described in U.S. Pat. Nos. 4,069,055 and 4,069,056 and Japanese Patent Laid-Open No. 140,140/1991; the phosphonium salts described in D. C. Necker et al., *Macromolecules,* 17, 2468 (1984), C. S. Wen et al., *Teh, Proc. Conf. Rad. Curing ASIA,* p. 478 Tokyo, October (1988), and U.S. Pat. Nos. 4,069,055 and 4,069,056; the iodonium salts described in J. V. Crivello et al., *Macromolecules* 10 (6), 1307 (1977), *Chem. & Eng. News,* November 28, p. 31 (1988), European Patent 104,143, U.S. Pat. Nos. 339,049 and 410,201, and Japanese Patent Laid-Open Nos. 150,848/1990 and 296,514/1990; the sulfonium salts described in J. V. Crivello et al., *Polymer J.,* 17, 73 (1985), J. V. Crivello et al.,*J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patent 370,693, U.S. Pat. No. 3,902,114, European Patents 233, 567, 297,443, and 297,442, U.S. Pat. Nos. 4,933,377, 410, 201, 339,049, 4,760,013, 4,734,444, and 2,833,827, and German Patents 2,904,626, 3,604,580, and 3,604,581; the selenonium salts described in J. V. Crivello et al., *Macromolecules,* 10 (6), 1307 (1977) and J. V. Crivello et al., *J. Polymer Sci., Polymer Chem. Ed.,* 17, 1047 (1979); and the arsonium salts described in C. S. Wen et al., *Teh, Proc. Conf. Rad. Curing ASIA,* p. 478 Tokyo, October (1988). Examples thereof further include the organohalogen compounds described in U.S. Pat. No. 3,905,815, Japanese Patent Publication No. 4605/1971, and Japanese Patent Laid-Open Nos. 36281/1973, 32070/1980, 239736/1985, 169835/1986, 169837/1986, 58241/1987, 212401/1987, 70243/1988, and 298339/1988; the organometallic compound/organic halide combinations described in K. Meier et al., *J. Rad. Curing,* 13 (4), 26 (1986), T. P. Gill et al., *Inorg. Chem.,* 19, 3007 (1980), D. Astruc,*Acc. Chem. Res.,* 19 (12), 377 (1896), and Japanese Patent Laid-Open No. 161445/1990; the photoacid generators having an o-nitrobenzyl type protective group described in S. Hayase et al., *J. Polymer Sci.,* 25, 753 (1987), E. Reichman et al., *J. Polymer Sci., Polymer Chem. Ed.,* 23, 1 (1985), Q. Q. Zhu et al.,*J. Photochem.,* 36, 85, 39, 317 (1987), B. Amit et al., *Tetrahedron Lett.,* (24) 2205 (1973), D. H. R. Barton et al.,*J. Chem Soc.,* 3571 (1965), P. M. Collins et al., *J. Chem. Soc.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), (1985), H. M. Houlihan et al., *Macromolecules,* 21, 2001 (1988), P. M. Collins et al.,*J. Chem. Soc., Chem. Commun.,* 532 (1972), S. Hayase et al., *Macromolecules,* 18, 1799 (1985), E.

Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156, 535, 271,851, and 0,388,343, U.S. Pat. Nos. 3,901,710 and 4,181,531, and Japanese Patent Laid-Open Nos. 198538/1985 and 133022/1978; compounds which photodecompose to generate a sulfonic acid and are represented by the iminosulfonates and the like described in Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199,672, 84,515, 199,672, 044, 115, and 0,101,122, U.S. Pat. Nos. 4,618,554, 4,371,605, and 4,431,774, and Japanese Patent Laid-Open Nos. 18143/1989, 245756/1990, and 140109/1991; and the disulfone compounds described in Japanese Patent Laid-Open No. 166544/1986.

Furthermore, a compound obtained by incorporating an acid generator into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, and Japanese Patent Laid-Open Nos. 26653/1988, 164824/1980, 69263/1987, 14603/1988, 163452/1988, 153853/1987, and 146029/1988.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

The amount of the acid generator to be added in the invention is generally about from 0.001 to 40% by weight, preferably from 0.01 to 20% by weight, more preferably from 0.1 to 5% by weight, based on all solid components of the photosensitive layer or heat-sensitive layer.

"Alkali-Soluble Compound"

The alkali-soluble compound which may be used in the positively sensitive composition is an alkali-soluble compound which has reduced alkali solubility in the presence of a dissolution inhibitor and recovers alkali solubility upon decomposition of the dissolution inhibitor.

Examples of the alkali-soluble compound for use in the positively sensitive composition include novolac resins, poly(hydroxystyrene)s, and acrylic resins.

The novolac resins which can be used in the invention are resins obtained by condensing a phenol with an aldehyde under acid conditions. Preferred examples of the novolac resins include novolac resins obtained from phenol and formaldehyde, novolac resins obtained from m-cresol and formaldehyde, novolac resins obtained from p-cresol and formaldehyde, novolac resins obtained from o-cresol and formaldehyde, novolac resins obtained from octylphenol and formaldehyde, novolac resins obtained from m- and p-cresols and formaldehyde, and novolac resins obtained from a mixture of phenol and one or more cresols (o-, m-, or p-cresol or any of an m- and p-cresol mixture, m- and o-cresol mixture, and o- and p-cresol mixture) and from formaldehyde. These novolac resins preferably have a weight-average molecular weight of from 800 to 200,000 and a number-average molecular weight of from 400 to 60,000.

Besides novolac resins, examples of the alkali-soluble compound for use in the positively sensitive composition include poly(hydroxystyrene)s, hydroxystyrene/N-substituted maleimide copolymers, hydroxystyrene/maleic anhydride copolymers, acrylic polymers having alkali-soluble groups, and urethane polymers having alkali-soluble groups. Examples of the alkali-soluble groups include a carboxyl group, phenolic hydroxyl group, sulfo group, phosphono group, and imide group.

In the case where a hydroxystyrene polymer, such as poly(p-hydroxystyrene), poly(m-hydroxystyrene), p-hydroxystyrene/N-substituted maleimide copolymer, or p-hydroxystyrene/maleic anhydride copolymer, is used, the weight-average molecular weight thereof is preferably from 2,000 to 500,000, more preferably from 4,000 to 300,000.

Examples of the acrylic polymers having alkali-soluble groups include methacrylic acid/benzyl methacrylate copolymers, poly(hydroxyphenylmethacrylamide), poly(hydroxyphenylcarbonyloxyethyl acrylate), poly(2,4-dihydroxyphenylcarbonyloxyethyl acrylate), and the alkali-soluble acrylic polymers described in Japanese Patent Application No. 211731/1996. These acrylic polymers are preferably ones having a weight-average molecular weight of from 2,000 to 500,000, more preferably from 4,000 to 300,000.

Examples of the urethane polymers having alkali-soluble groups include resins obtained by reacting diphenylmethane diisocyanate and hexamethylene diisocyanate with tetraethylene glycol and 2,2-bis(hydroxymethyl)propionic acid.

Preferred of those alkali-soluble polymers from the standpoint of developability are the hydroxystyrene polymers and the acrylic copolymers having alkali-soluble groups.

The alkali-soluble compounds to be used in the invention may have been protected by an acid-decomposable group. Examples of the acid-decomposable group include an ester group and carbamate group.

The content of those alkali-soluble compounds in the photosensitive layer or heat-sensitive layer in the invention is generally about from 10 to 90% by weight, preferably from 20 to 85% by weight, more preferably from 30 to 80% by weight, based on all solid components of the layer. In case where the content of the alkali-soluble compounds is lower than 10% by weight, the photosensitive layer or heat-sensitive layer has impaired durability. On the other hand, contents thereof exceeding 90% by weight are undesirable from the standpoints of both sensitivity and durability.

Those alkali-soluble compounds may be used alone or in combination of two or more thereof.

"Dissolution Inhibitor"

The dissolution inhibitor which may be used in the positively sensitive composition is a compound which decomposes by the action of an acid to become alkali-soluble. Examples of the dissolution inhibitor include the carboxylic acids and phenol compounds which are protected by a chemical amplification type acid-decomposable group used in the field of resists, such as t-butyl esters, t-butyl carbamate, and alkoxyethyl esters.

The content of the dissolution inhibitor in the photosensitive layer or heat-sensitive layer in the invention is generally about from 5 to 90% by weight, preferably from 10 to 80% by weight, based on all solid components of the layer.

Preferred quinonediazide compounds include o-quinonediazide compounds.

The o-quinonediazide compounds which can be used in the invention are compounds of various structures which have at least one o-quinonediazide group and come to enhance alkali-solubility upon thermal decomposition. Namely, upon thermal decomposition, o-quinonediazide not only is deprived of its ability to inhibit alkali-soluble compounds from dissolving but also changes itself into an alkali-soluble substance. Based on these two effects, o-quinonediazide helps the sensitive material to dissolve. Examples of o-quinonediazide compounds which can be used in the invention are given in J. Kosar, Light-Sensitive Systems, pp. 339–352 (John Wiley & Sons, Inc.). However, sulfonic acid esters or sulfonamides of o-quinonediazide which are obtained by reaction with various aromatic polyhydroxy compounds or aromatic amino compounds are especially preferred. Also preferred are esters of benzoquinone-(1,2)-diazidesulfonyl chloride or naphthoquinone-(1,2)-diazide-5-sulfonyl chloride with a pyrogallol-acetone resin, such as those described in Japanese Patent Publication No. 28403/1968, and the esters of benzoquinone-(1,2)-diazidesulfonyl chloride or naphthoquinone-(1,2)-diazide-5-sulfonyl chloride with a phenol-formaldehyde resin which are described in U.S. Pat. Nos. 3,046,120 and 3,188,210.

Furthermore, esters of naphthoquinone-(1,2)-diazide-4-sulfonyl chloride with a phenol-formaldehyde resin or cresol-formaldehyde resin and esters of naphthoquinone-(1,2)-diazide-4-sulfonyl chloride with a pyrogallol-acetone resin are also preferred. Other useful o-quinonediazide compounds are known, which are reported in many patent documents. Examples thereof are described in, e.g, Japanese Patent Laid-Open Nos. 5303/1972, 63802/1973, 63803/1973, 96575/1973, 38701/1974, and 13354/1973, Japanese Patent Publications Nos. 11222/1966, 9610/1970, and 17481/1974, U.S. Pat. Nos. 2,797,213, 3,454,400, 3,544,323, 3,573,917, 3,674,495,and 3,785,825,British Patents 1,227,602, 1,251,345, 1,267,005, 1,329,888, and 1,330,932, and German Patent 854,890.

The content of the o-quinonediazide compounds in the photosensitive layer or heat-sensitive layer in the invention is generally about from 1 to 50% by weight, preferably from 5 to 30% by weight, more preferably from 10 to 30% by weight, based on all solid components of the layer. Those compounds may be used alone or as a mixture of two or more thereof. In case where the content of the o-quinonediazide compounds is lower than 1% by weight, image-recording properties are impaired. On the other hand, contents thereof exceeding 50% by weight result in impaired durability of image areas and reduced sensitivity.

In the photosensitive layer or heat-sensitive layer in the invention, the content of the dissolution inhibitive compounds other than o-quinonediazide compounds is generally about from 1 to 50% by weight, preferably from 5 to 30% by weight, more preferably from 10 to 30% by weight, based on all solid components of the layer.

(Negatively Sensitive Composition)

The following known negatively sensitive compositions ((g) to (j)) can be used in the invention.

(g) A negatively sensitive composition comprising a polymer having photocrosslinkable groups and an azide compound.

(h) The negatively sensitive composition described in Japanese Patent Laid-Open No. 101651/1984, which contains a diazo compound.

(i) The photopolymerizable, negatively sensitive composition described in U.S. Pat. No. 262,276 and Japanese Patent Laid-Open No. 63054/1990, which comprises a photopolymerization initiator and an addition-polymerizable unsaturated compound.

(j) The negatively sensitive composition described in Japanese Patent Laid-Open No. 095421/1999, which comprises an alkali-soluble compound, an acid generator, and an acid-crosslinkable compound.

The compounds used in the negatively sensitive compositions (g) to (j) will be explained below.

"Polymer having Photocrosslinkable Groups"

The polymer having photocrosslinkable groups which may be used in the negatively sensitive composition preferably is a polymer having photocrosslinkable groups having an affinity for aqueous alkaline developing solutions. Examples thereof include the polymer described in U.S. Pat. No. 5,064,747 which has photocrosslinkable groups, such as —CH=CH—CO—, in the main chain or side chains of the molecule; the copolymer described in Japanese Patent Publication No. 15711/1979 which has cinnamate groups and carboxyl groups; the polyester resin described in Japanese Patent Laid-Open No. 165646/1985 which has phenylenediacrylic acid residues and carboxyl groups; the polyester resin described in Japanese Patent Laid-Open No. 203630/1985 which has phenylenediacrylic acid residues and phenolic hydroxyl groups; the polyester resin described in Japanese Patent Publication No. 42858/1982 which has phenylenediacrylic acid residues and sodiumiminodisulfonyl groups; and the polymer described in Japanese Patent Laid-Open No. 208552/1984 which has azide groups and carboxyl groups in side chains.

The content of the polymer having photocrosslinkable groups in the photosensitive layer or heat-sensitive layer in the invention is generally about from 5 to 100% by weight, preferably from 10 to 95% by weight, more preferably from 20 to 90% by weight, based on all solid components of the layer.

"Azide Compound"

Examples of the azide compound which may be used in the negatively sensitive composition include 2,6-bis(4-azidobenzal)-4-methylcyclohexane and 4,4'-diazidodiphenyl sulfide.

The content of the azide compound in the photosensitive layer or heat-sensitive layer in the invention is generally about from 5 to 95% by weight, preferably from 10 to 90% by weight, more preferably from 20 to 80% by weight, based on all solid components of the layer.

"Alkali-Soluble Compound"

The alkali-soluble compound which may be used in the negatively sensitive composition is the same as the alkali-soluble compound for use in the positively sensitive composition.

"Diazo Compound"

Examples of the diazo resin which may be used in the negatively sensitive composition include diazo resins represented by salts of condensates of a diazodiarylamine with an active carbonyl compound. Preferred are the diazo resins which are photosensitive, insoluble in water, and soluble in organic solvents.

Especially preferred examples of such diazo resins include organic acid salts or inorganic acid salts of condensates of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, or 4-diazo-3-methoxydiphenylamine with formaldehyde, paraformaldehyde, acetaldehyde, benzaldehyde, 4,4'-bismethoxymethyldiphenyl ether.

Examples of the organic acid include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, and 2-hydroxy-4-methoxybenzophenone-5-sulfonic acid. Examples of the inorganic acid include hexafluorophosphoric acid, tetrafluoroboric acid, and thiocyanic acid.

Other usable examples of the diazo compound include the diazo resin described in Japanese Patent Laid-Open No. 30121/1979 in which the main chain is a polyester chain; the diazo resin described in Japanese Patent Laid-Open No. 273538/1986 which is a resin obtained by reacting a polymer having carboxylic anhydride residues with a diazo compound having a hydroxyl group; and a diazo resin obtained by reacting a polyisocyanate compound with a diazo compound having a hydroxyl group.

The content of the diazo resin in the photosensitive layer or heat-sensitive layer in the invention is preferably about from 0 to 40% by weight based on all solid components of the layer. Two or more diazo resins maybe used in combination according to need.

"Photopolymerization Initiator and Addition-Polymerizable Unsaturated Compound"

Examples of the addition-polymerizable unsaturated compound and photopolymerization initiator which may be used in the negatively sensitive composition include the addition-polymerizable unsaturated compounds having two or more terminal ethylene groups which are described in U.S. Pat. Nos. 2,760,863 and 3,060,023 and Japanese Patent Laid-Open No. 121448/1987 and the photopolymerization initiators described therein.

The content of the addition-polymerizable unsaturated compound in the photosensitive layer or heat-sensitive layer in the invention is generally about from 5 to 95% by weight, preferably from 5 to 80% by weight, based on all solid components of the layer. The content of the photopolymerization initiator in the photosensitive layer or heat-sensitive layer is generally about from 1 to 80% by weight, preferably from 5 to 50% by weight, based on all solid components of the layer.

"Acid Generator"

The acid generator which may be used in the negatively sensitive composition is the same as the acid generator for use in the positively sensitive composition.

"Acid-Crosslinkable Compound"

The acid-crosslinkable compound which may be used in the negatively sensitive composition means a compound which crosslinks in the presence of an acid. Examples thereof include aromatic and heterocyclic compounds substituted with two or more groups selected from hydroxylmethyl, acetoxymethyl, and alkoxymethyl groups. Preferred of these are compounds obtained by condensing a phenol with an aldehyde under basic conditions.

Preferred examples of such compounds include compounds obtained by condensing phenol with formaldehyde under basic conditions as stated above, compounds likewise obtained from m-cresol and formaldehyde, compounds likewise obtained from bisphenol A and formaldehyde, compounds likewise obtained from 4,4'-bisphenol and formaldehyde, and the compound disclosed as a resol resin in GB 2,082,339.

Those acid-crosslinkable compounds preferably have a weight-average molecular weight of from 500 to 100,000 and a number-average molecular weight of from 200 to 50,000.

Other preferred examples of the acid-crosslinkable compound include the aromatic compound substituted with an alkoxymethyl or oxiranylmethyl group disclosed in EP-A 0,212,482, the condensate of monomeric or oligomeric melamine with formaldehyde and the urea-formaldehyde condensate which are disclosed in EP-A 0,133,216, DE-A 3,634,671, and DE 3,711,264, and the alkoxy-substituted compound disclosed in EP-A 0,212,482.

Still other preferred examples include a melamine-formaldehyde derivative having at least two free N-hydroxymethyl, N-alkoxymethyl, or N-acyloxymethyl groups. Especially preferred of these is the N-alkoxymethyl derivative.

Low-molecular or oligomeric silanols can be used as silicon-containing crosslinking agents. Examples thereof include dimethyl- and diphenylsilanediols and oligomers which have undergone preliminary condensation and contain units of any of these. For Example, the oligomer disclosed in EP-A 0,377,155 can be used.

The invention will be explained below in more detail by reference to the following Examples.

EXAMPLE 1

Synthesis of Polymer Compound 1

Into a 500-mL three-necked flask were introduced 50 g of acrylamide, 3.4 g of mercaptopropyltrimethoxysilane, and 220 g of dimethylformamide. Thereto was added 0.5 g of 2,2-azobis (2,4-dimethylvaleronitrile) in a 65° C. nitrogen stream. The resultant mixture was kept at that temperature for 6 hours with stirring, subsequently cooled to room temperature, and then poured into 2 L of ethyl acetate. As a result, a solid separated out. This solid weighed 52.4 g after drying. GPC revealed that the solid was a polymer having a weight-average molecular weight of 3,000 (calculated for standard polystyrene), and $^{13}$C-NMR spectroscopy (DMSO-$d_6$) revealed that the polymer had a trimethoxysilyl group (50.0 ppm) incorporated into a terminal thereof.

EXAMPLE 2

Syntheses of Polymer Compounds 2 to 9

Polymer compounds 2 to 9 were synthesized in the same manner as for polymer compound 1, except that corresponding monomers were used in place of acrylamide. Through $^{13}$C-NMR spectroscopy, the polymer compounds thus synthesized were ascertained to be polymers each having a trimethoxysilyl group incorporated into a terminal thereof. In Table 1 are shown the weight-average molecular weights (calculated for standard polystyrene) of the polymer compounds as determined by GPC.

TABLE 1

| Polymer Compound | Weight-average Molecular Weight |
| --- | --- |
| 2 | 4500 |
| 3 | 3300 |
| 4 | 4200 |
| 5 | 5600 |
| 6 | 6800 |
| 7 | 2200 |
| 8 | 3300 |
| 9 | 1900 |

EXAMPLE 3

Synthesis of Polymer Compound 10

Into a 500-mL three-necked flask were introduced 50 g of acrylamide, 3.1 g of mercaptomethylmethyldiethoxysilane, and 212 g of dimethylformamide. Thereto was added 0.5 g of 2,2-azobis (2,4-dimethylvaleronitrile) in a 65° C. nitrogen stream. The resultant mixture was kept at that temperature for 6 hours with stirring, subsequently cooled to room temperature, and then poured into 2 L of ethyl acetate. As a result, a solid separated out. This solid weighed 50.5 g after drying. GPC revealed that the solid was a polymer having a weight-average molecular weight of 2,500 (calculated for standard polystyrene), and $^{13}$C-NMR spectroscopy (DMSO-$d_6$) revealed that the polymer had a methyldiethoxysilyl group (58.3 ppm) incorporated into a terminal thereof.

EXAMPLE 4

Synthesis of Polymer Compound 11

Into a 500-mL three-necked flask were introduced 50 g of acrylic acid, 3.1 g of mercaptopropylmethyldimethoxysilane, and 212 g of dimethylformamide. Thereto was added 0.5 g of 2,2-azobis (2,4-dimethylvaleronitrile) in a 65° C. nitrogen stream. The resultant mixture was kept at that temperature for 6 hours with stirring, subsequently cooled to room temperature, and then poured into 2 L of ethyl acetate. As a result, a solid separated out. This solid weighed 49.5 g after drying. GPC revealed that the solid was a polymer having a weight-average molecular weight of 2,700 (calculated for standard polystyrene), and $^{13}$C-NMR spectroscopy (DMSO-$d_6$) revealed that the polymer had a methyldimethoxysilyl group (50.0 ppm) incorporated into a terminal thereof.

EXAMPLE 5

Synthesis of Polymer Compounds 12 to 17

Polymer compounds 12 to 17 were synthesized in the same manner as for polymer compound 1, except that corresponding monomers were used in place of the acrylamide and that methanol and dimethyl 2,2'-azobis(isobutyrate) were used in place of the dimethylformamide and the 2,2'-azobis(2,4-dimethylvaleronitrile), respectively. It was ascertained by $^{13}$C-NMR spectroscopy (DMSO-$d_6$) that these polymers synthesized each were a polymer having a trimethoxysilyl group (50.0 ppm) incorporated into a terminal thereof. In Table 2 are shown the weight-average molecular weights of these polymers determined by GPC (calculated for standard polyethylene glycol).

TABLE 2

| Polymer Compound | Weight-Average Molecular Weight |
|---|---|
| 12 | 9,000 |
| 13 | 11,000 |
| 14 | 10,000 |
| 15 | 8,000 |
| 16 | 9,000 |
| 17 | 11,000 |

EXAMPLE 6

Synthesis of Polymer Compound 18

Into a 500-mL three-necked flask was introduced 135 g of methanol. Thereto were gradually added dropwise over 2 hours 50 g of acrylamide, 8.7 g of N-vinylpyrrolidone, 7.7 g of mercaptopropyltrimethoxysilane, 0.54 g of dimethyl 2,2'-azobis(isobutyrate), and 135 g of methanol in a 60° C. nitrogen stream. After completion of the dropwise addition, the resultant mixture was kept at that temperature for 4 hours with stirring, subsequently cooled to room temperature, and then poured into 2 L of acetone to precipitate a solid. This solid was taken out by filtration and dried. After the drying, the solid weighed 60.5 g. GPC revealed that the solid was a polymer having a weight-average molecular weight of 9,000 (in terms of standard polyethylene glycol), and $^{13}$C-NMR spectroscopy (DMSO-$d_6$) revealed that the polymer had a trimethoxysilyl group (50.0 ppm) incorporated into a terminal thereof.

EXAMPLE 7

Synthesis of Polymer Compounds 19 to 23

Polymer compounds 19 to 23 were synthesized in the same manner as for polymer compound 8, except that corresponding monomers were used in place of the acrylamide and the N-vinylpyrrolidone. It was ascertained by $^{13}$C-NMR spectroscopy (DMSO-$d_6$) that these polymers synthesized each were a polymer having a trimethoxysilyl group (50.0 ppm) incorporated into a terminal thereof. In Table 3 are shown the weight-average molecular weights of these polymers determined by GPC (calculated for standard polyethylene glycol).

TABLE 3

| Polymer Compound | Weight-Average Molecular Weight |
|---|---|
| 19 | 10,000 |
| 20 | 8,000 |
| 21 | 8,000 |
| 22 | 11,000 |
| 23 | 12,000 |

According to the invention, a novel hydrophilic polymer can be obtained which can be effectively utilized in various coating materials including antifogging paints and exterior antifouling paints.

[Surface-Modified-Particle Synthesis Example 1]

Surface-modified particles (S-1) comprising silica particles whose surface had been modified with a hydrophilic polymer having a silane coupling group at a terminal were synthesized by the following procedure.

(Synthesis of Hydrophilic Polymer (P-1) (=Polymer Compound 1) Having Silane Coupling Group at Terminal)

Into a three-necked flask were introduced 25 g of acrylamide, 3.5 g of 3-mercaptopropyltrimethoxysilane, and 51.3 g of dimethylformamide. In a nitrogen stream, the mixture was heated to 65° C. and 0.25 g of 2,2'-azobis(2,4-dimethylvaleronitrile) was added thereto to initiate a reaction. The reaction mixture was stirred for 6 hours, subsequently cooled to room temperature, and then poured into 1.5 L of ethyl acetate. As a result, a solid separated out. This solid was taken out by filtration, sufficiently washed with ethyl acetate, and then dried (yield: 21 g). GPC revealed that the solid was a polymer having a weight-average molecular weight of 5,000 (calculated for standard polystyrene)

(Synthesis of Surface-Modified Silica Particles (S-1))

Into a high-speed stirring machine were introduced 10 g of fine silica particles (Sylysia 350, manufactured by Fuji Silysia Chemical Ltd.), 8 g of the hydrophilic polymer having a silane coupling group at a terminal, 1 g of benzooxasilepine dimethyl ester, 5 g of 25% aqueous ammonia solution, and 200 mL of toluene. The contents were mixed by stirring at 18,000 rpm for 1 hour.

The resultant mixture was placed in a flask equipped with a stirrer, condenser tube, and trap for dehydration and stirred therein for 2 hours with heating at the toluene refluxing temperature. After the stirring, the contents were transferred to a centrifugal separator and centrifuged at 7,000 rpm for 30 minutes. Thus, the mixture was separated into a toluene solution and a precipitate. This precipitate was dispersed into 400 mL of water with an ultrasonic dispersing machine and then centrifuged with the centrifugal separator again to thereby wash the precipitate. This operation for washing with acetone was repeated twice. The precipitate thus obtained was allowed to dry naturally to obtain 14.4 g of a white powder (S-1). This powder was analyzed with TG-DTA (manufactured by Seiko Instruments Inc.) to determine the thermal weight loss attributable to organic matter. As a result, a weight loss of 12.5% was observed.

[Surface-Modified-Particle Synthesis Example 2]

Surface-modified particles (S-2) comprising silica particles whose surface had been modified with a hydrophilic polymer having a silane coupling group at a terminal were synthesized by the following procedure.

(Synthesis of Hydrophilic Polymer (P-2) (=Polymer Compound 2) Having Silane Coupling Group at Terminal)

Into a three-necked flask were introduced 25 g of 2-acrylamido-2-methylpropanesulfonic acid, 1.2 g of 3-mercaptopropyltrimethoxysilane, and 52.4 g of methanol. In a nitrogen stream, the mixture was heated to 60° C. and 0.25 g of 2,2'-azobisisobutyronitrile was added thereto to initiate a reaction. The reaction mixture was stirred for 6 hours, subsequently cooled to room temperature, and then poured into 1.5 L of acetone. As a result, a solid separated out. This solid was taken out by filtration, sufficiently washed with acetone, and then dried (yield: 19 g). GPC revealed that the solid was a polymer having a weight-average molecular weight of 3,500 (calculated for standard polystyrene).

(Synthesis of Surface-Modified Silica Particles (S-2))

Surface-modified particles (S-2) were synthesized in the same manner as in the Surface-Modified-Particle Synthesis Example 1, except that the hydrophilic polymer (P-2) having a silane coupling group at a terminal was used. The yield of the particles (S-2) was 13.2 g. The thermal weight loss thereof as determined with TG-DTA (manufactured by Seiko Instruments Inc.) was found to be 10.5%.

[Surface-Modified-Particle Synthesis Example 3]

Surface-modified particles (S-3) comprising silica particles whose surface had been modified with a hydrophilic polymer having a silane coupling group at a terminal were synthesized by the following procedure.

(Synthesis of Hydrophilic Polymer (P-4) (Polymer Compound 4) Having Silane Coupling Group at Terminal)

Into a three-necked flask were introduced 50 g of N-vinylacetamide, 5.8 g of 3-mercaptopropyltrimethoxysilane, and 111.5 g of dimethylacetamide. In a nitrogen stream, the mixture was heated to 65° C. and 0.5 g of 2,2'-azobis(2,4-dimethylvaleronitrile) was added thereto to initiate a reaction. The reaction mixture was stirred for 6 hours, subsequently cooled to room temperature, and then poured into 2.0 L of ethylacetate. As a result, a solid separated out. This solid was taken out by filtration, sufficiently washed with acetone, and then dried (yield: 42 g). GPC revealed that the solid was a polymer having a weight-average molecular weight of 6,000 (calculated for standard polystyrene).

(Synthesis of Surface-Modified Silica Particles (S-3))

Into a three-necked flask were introduced 50 g of an aqueous colloidal silica solution (Snowtex ZL, manufactured by Nissan Chemical Industries, Ltd.) and 6 g of the hydrophilic polymer (P-4) having a silane coupling group at a terminal. The pH of this mixture was adjusted to 7.5. The mixture was stirred at 70° C. for 4 hours, subsequently cooled to room temperature, and then poured into 500 mL of acetone. As a result, a solid separated out. This solid was taken out and dried.

After the drying, the solid was redispersed into water and the dispersion was centrifuged with a centrifugal separator to precipitate the silica particles. The supernatant was removed. This operation was repeated twice to purify the solid. The yield of the surface-modified silica particles (S-3) thus purified was 15 g. The particles (S-3) were analyzed with TG-DTA (manufactured by Seiko Instruments Inc.) to determined the thermal weight loss attributable to organic matter. As a result, a weight loss of 19.5% was observed.

[Surface-Modified-Particle Synthesis Example 4]

Surface-modified particles (S-4) comprising silica particles whose surface had been modified with a hydrophilic polymer having a silane coupling group at a terminal were synthesized by the following procedure.

(Synthesis of Hydrophilic Polymer (P-5) (=Polymer Compound 5) Having Silane Coupling Group at Terminal)

Into a three-necked flask were introduced 50 g of acrylic acid, 6.8 g of 3-mercaptopropyltrimethoxysilane, and 114 g of dimethylacetamide. In a nitrogen stream, the mixture was heated to 65° C. and 0.5 g of 2,2'-azobis(2,4-dimethylvaleronitrile) was added thereto to initiate a reaction. The reaction mixture was stirred for 6 hours, subsequently cooled to room temperature, and then poured into 2.0 L of ethylacetate. As a result, a solid separated out. This solid was taken out by filtration, sufficiently washed with acetone, and then dried (yield: 45 g). GPC revealed that the solid was a polymer having a weight-average molecular weight of 1,500 (calculated for standard polystyrene).

(Synthesis of Surface-Modified Silica Particles (S-4))

Surface-modified silica particles (S-4) were synthesized in the same manner as in the Surface-Modified-Particle Synthesis Example 3, except that the hydrophilic polymer (P-5) having a silane coupling group at a terminal was used. The yield of the particles (S-4) was 12.5 g. The thermal weight loss thereof as determined with TG-DTA (manufactured by Seiko Instruments Inc.) was found to be 18.6%.

[Surface-Modified-Particle Synthesis Example 5]

Surface-modified particles (S-5) comprising silica particles having a hydrophilic polymer incorporated onto the surface thereof in a manner similar to grafting were synthesized by the following procedure.

Into a three-necked flask were introduced 6 g of fine silica particles (Aerosil 200, manufactured by Nippon Aerosil Co., Ltd.), 4 g of 3-mercaptopropyltrimethoxysilane, and 196 mL of toluene. The resultant mixture was reacted in a nitrogen stream for 12 hours at the toluene refluxing temperature, subsequently cooled to room temperature, and then poured into 1 L of methanol. This methanol mixture was allowed to stand for 24 hours. Thereafter, the resultant precipitate was taken out by filtration and dried (yield: 5.2 g).

Into a three-necked flask were introduced 4 g of the silica obtained above, 72 mL of 4.7 mol/L aqueous acrylamide solution, and 8 mL of 0.2 mol/L aqueous solution of diammonium nitrate-cerium (IV) nitrate prepared with 1 mol/L aqueous nitric acid solution. The resultant mixture was reacted at 30° C. in a nitrogen stream for 1 hour and then poured into 1 L of acetone. As a result, a solid separated out. This solid was taken out and dried.

After the drying, the solid was redispersed into water and the dispersion was centrifuged with a centrifugal separator to precipitate the silica particles. The supernatant was removed. This operation was repeated twice to purify the solid. The yield of the surface-modified silica particles (S-5) thus purified was 3.5 g. The particles (S-3) were analyzed with TG-DTA (manufactured by Seiko Instruments Inc.) to determined the thermal weight loss attributable to organic matter. As a result, a weight loss of 20.5% was observed.

[Surface-Modified-Particle Synthesis Example 6]

Surface-modified particles (S-6) comprising silica particles having a hydrophilic polymer incorporated onto the surface thereof in a manner similar to grafting were synthesized by the following procedure.

Surface-modified particles (S-6) comprising silica particles having a hydrophilic polymer incorporated onto the surface thereof in a manner similar to grafting were synthesized by the same method as in Synthesis Example 5, except that an aqueous solution of 2-acrylamido-2-methylpropanesulfonic acid was used in place of the aqueous acrylamide solution. The yield of the particles (S-6) was 3.1 g. The thermal weight loss thereof as determined with TG-DTA (manufactured by Seiko Instruments Inc.) was found to be 19.3%.

EXAMPLE 8

Positive Type Photosensitive Lithographic Printing Plate Precursor

[Formation of Hydrophilic Layer]

To 1 g of the surface-modified particles (S-1) was added 3 g of methanol. The resultant mixture was shaken with a paint shaker together with glass beads for 30 minutes to obtain a methanol dispersion of the surface-modified particles (S-1). To this dispersion were added 0.3 g of tetraethoxysilane and 0.06 g of phosphoric acid/water (1/1 by weight). This mixture was stirred at room temperature for 20 minutes to cause hydrolysis. Thus, a homogeneous dispersion was obtained.

The dispersion obtained was applied with a rod bar #10 on a poly(ethylene terephthalate) film support having a thickness of 250 μm (360 g/m$^2$) coated with a hydrophilic adhesive layer. The dispersion applied was dried at 100° C. for 10 minutes to obtain a hydrophilic layer. The contact angle of the hydrophilic layer obtained was measured (waterdrop in air; CA-Z, manufactured by Kyowa Kaimen Kagaku K.K.) and was found to be 10°.

The following image-forming layer was formed as a positive photosensitive coating layer on the thus-formed hydrophilic layer to produce a positive type photosensitive lithographic printing plate precursor. This printing plate precursor was subjected to exposure, development, and evaluation for printing performance.

[Composition of Image-Forming Layer]

(Alkali-Soluble Polymer/naphthoquinone-1,2-diazide Composition (Conventional Positive Composition))

A composition consisting of 0.9 g of an ester of naphthoquinone-1,2-diazide-4-sulfonyl chloride with a pyrogallol-acetone resin, 0.05 g of Victoria Pure Blue BOH, 2.0 g of a novolac resin obtained from cresol and formaldehyde (meta:para=6:4; weight-average molecular weight, 1,800), 20 g of methyl ethyl ketone, and 7 g of methyl alcohol was applied to the hydrophilic layer. Thus, a positive type lithographic printing plate precursor of Example 8 was obtained.

The positive type lithographic printing plate precursor of Example 8 thus obtained was exposed to a PS light through a step guide manufactured by Fuji Photo Film Co., Ltd., and then processed by an automatic processor containing developer DP-4 (1:8), manufactured by Fuji Photo Film Co., Ltd. Subsequently, printing was conducted with Heidelberg printing press KOR-D. As a result, 5,000 satisfactory printed sheets were obtained in which the nonimage areas were free from soils.

EXAMPLES 9 TO 12

The same procedure as in Example 8 was conducted, except that each of the particulate surface-modified materials shown in Table 4 below was used as particles modified with a hydrophilic polymer. Thus, photosensitive lithographic printing plate precursors were produced. These printing plate precursors were subjected to exposure and development and evaluated for printing performance. The results obtained are shown in Table

TABLE 4

| Example | Surface-modified particles | Contact angle of hydrophilic layer (degrees) | Printing performance (soiling in 5000-sheet printing) |
|---|---|---|---|
| 9 | S-3 | 9 | no soiling |
| 10 | S-4 | 12 | no soiling |
| 11 | S-5 | 15 | no soiling |
| 12 | S-6 | 8 | no soiling |

EXAMPLE 13

Negative Type Heat-Sensitive Lithographic Printing Plate Precursor

The same support and hydrophilic layer as in Example 8 were used. A heat-sensitive layer as an image-forming layer was formed by applying the composition shown below to produce a negative type heat-sensitive lithographic printing plate precursor, which was subjected to exposure and development and evaluated for printing performance.

[Synthesis of Crosslinking Agent A]

In 100 mL of aqueous potassium hydroxide solution (10%) was dissolved 20 g of 1-[α-methyl-α-(4-hydroxyphenyl)ethyl]-4-[α,α-bis(4-hydroxy phenyl)ethyl]benzene. To this solution was added, with stirring at room temperature, 60 mL of formalin (37%) over 1 hour. This reaction mixture was stirred at room temperature for further 6 hours and then poured into an aqueous sulfuric acid solution to cause crystallization. The resultant pasty precipitate was sufficiently washed with water and then recrystallized with 30 mL of methanol. Thus, a white powder was obtained (yield, 20 g).

NMR spectroscopy revealed that the compound obtained was a hexamethylol compound of 1-[α-methyl-α-(4-hydroxyphenyl)ethyl]-4-[α,α-bis(4-hydroxy phenyl)ethyl] benzene. The purity of this hexamethylol compound, as determined by reversed-phase HPLC (column, Shimpac CLC-ODS (manufactured by Shimadzu Corp.); solvent, methanol/water=60/40→90/10), was 92%. In 1,000 mL of methanol was dissolved 20 g of the hexamethylol compound with heating. One milliliter of concentrated sulfuric acid was added thereto, and the resultant mixture was heated with refluxing for 12 hours and then cooled. Thereafter, 2 g of potassium carbonate was added thereto, and this mixture was stirred and then concentrated. To the concentrate was added 300 mL of ethyl acetate. The resultant mixture was washed with water and dried, and the solvent was then distilled off. As a result, a white solid was obtained (yield, 22 g).

The compound obtained was found to be a hexamethoxymethyl compound of 1-[α-methyl-α-(4-hydroxyphenyl)ethyl]-4-[α,α-bis(4-hydroxyphenyl)ethyl]benzene. The purity of this hexamethoxymethyl compound, as determined by reversed-phase HPLC (column, Shimpac CLC-ODS (manufactured by Shimadzu Corp.); solvent, methanol/water=60/40→90/10), was 90%.

[Composition of Image-Forming Layer]

A composition consisting of 0.1 g of IRG22 (IR dye manufactured by Nippon Kayaku Co., Ltd.), 0.21 g of the crosslinking agent A, 2.1 g of a phenol-formaldehyde novolac (weight-average molecular weight, 12,000), 0.02 g of diphenyliodonium 9,10-dimethoxyanthracenesulfonate, 0.06 g of Megaface F-176 (fluorochemical surfactant manufactured by Dainippon Ink & Chemicals, Inc.), 15 g of methyl ethyl ketone, and 12 g of 2-methoxy-1-propane was applied to the same support as in the Examples given above. Thus, a negative type heat-sensitive lithographic printing plate precursor of Example 13 was obtained.

The negative type lithographic printing plate precursor of Example 13 thus obtained was exposed with a semiconductor laser (wavelength, 825 nm; beam diameter, $1/e^2=6$ μm) as a heat mode laser at a linear velocity of 8 m/sec and a plate surface output of 110 mW. After the exposure, the printing plate precursor was heat-treated at 110° C. for 1 minute and then processed by an automatic processor containing developer DP-4 (1:8) and rinse FR-3 (1:7), both manufactured by Fuji Photo Film Co., Ltd. Subsequently, the plate surface was treated with gum GU-7 (1:1), manufactured by Fuji Photo Film Co., Ltd. Printing was conducted with Heidelberg printing press KOR-D. As a result, 6,000 printed sheets were obtained in which the nonimage areas were free from soils.

Subsequently, the negative type lithographic printing plate precursor of Example 13 was stored at 45° C. and a relative humidity of 75% and then subjected to the same processing. As a result, this printing plate also gave satisfactory printed sheets in which the nonimage areas were free from soils. The number of the printed sheets thus obtained was 5,000.

The lithographic printing plate base of the invention which comprises a support and formed thereon a hydrophilic layer comprising solid particles to the surface of which a hydrophilic polymer is directly chemically bonded and a polymer compound having hydrophilic functional groups has the following advantage. By forming a suitable sensitive layer on the hydrophilic layer, excellent hydrophilicity can be obtained without a sacrifice of film strength. The printing plate base gives a lithographic printing plate which has been greatly improved especially in the property of not causing scumming and gives scumming-free printed matters even under sever printing conditions.

What is claimed is:

1. A polymer compound having weight average molecular weight of 1,000 to 100,000 and comprising:
   i) a polymer structure represented by —(CHR$^3$—CR$^4$(-L$^1$-Y$^1$))$_x$—(CHR$^5$—CR$^6$(-L$^2$-Y$^2$))$_y$—; and
   ii) a silane coupling group represented by —S—(CH$_2$)$_n$—Si—(R$^1$)$_m$(OR$^2$)$_{3-m}$, as a terminal of the polymer structure,
   wherein R$^1$, R$^2$, R$^3$, R$^4$, R$^5$, and R$^6$ each independently represents a hydrogen atom or a hydrocarbon group having 1 to 8 carbon atoms; m represents 0, 1 or 2; n represents an integer of 1 to 8; x is 100 to 1 mol %; y is 0 to 99 mol %; x+y=100 mol %; L$^1$ and L$^2$ each independently represents a single bond or an organic connecting group; and Y$^1$ and Y$^2$ each independently represents —N(R$^7$)(R$^8$), —OH, —NHCOR$^7$, —COR$^7$, —CO$_2$M, or —SO$_3$M, wherein R$^7$ and R$^8$ each independently represents a hydrogen atom or an alkyl group having 1 to 8 carbon atoms and M represents a hydrogen atom, an alkali metal, an alkaline earth metal, or an onium.

2. A lithographic printing plate base comprising: a support and a hydrophilic layer containing solid particles to a surface of which a hydrophilic polymer is chemically bonded, wherein the hydrophilic polymer is a polymer compound according to claim 1.

* * * * *